United States Patent
Mariyama et al.

(10) Patent No.: US 7,157,747 B2
(45) Date of Patent: Jan. 2, 2007

(54) BIDIRECTIONAL PHOTOTHYRISTOR CHIP, LIGHT-FIRED COUPLER AND SOLID STATE RELAY

(75) Inventors: Mitsuru Mariyama, Kitakatsuragi-gun (JP); Masaru Kubo, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/731,087

(22) Filed: Dec. 10, 2003

(65) Prior Publication Data

US 2005/0006661 A1  Jan. 13, 2005

(30) Foreign Application Priority Data

Dec. 10, 2002 (JP) ............... 2002-357650
Sep. 29, 2003 (JP) ............... 2003-337448

(51) Int. Cl.
*H01L 31/111* (2006.01)
(52) U.S. Cl. ............... 257/119; 257/114; 257/107; 257/113; 257/118; 257/E31.071
(58) Field of Classification Search ............ 257/107, 257/E31.071, 114, 119, 113, 118, E29.036, 257/E29.037, E29.038, E29.039, E29.047, 257/E29.048
See application file for complete search history.

(56) References Cited

U.S. PATENT DOCUMENTS 4,016,593 A * 4/1977 Konishi et al. ............. 257/116
5,278,076 A * 1/1994 Darwish ..................... 438/135
6,037,613 A * 3/2000 Mariyama .................. 257/119
2002/0074608 A1* 6/2002 Aoki et al. ................. 257/376
2006/0027832 A1* 2/2006 Mariyama et al. .......... 257/118

FOREIGN PATENT DOCUMENTS

| JP | 02125666 A * | 5/1990 |
| JP | 5-315603 | 11/1993 |
| JP | 6-350077 | 12/1994 |
| JP | 8-97403 | 4/1996 |
| JP | 8-264755 | 10/1996 |
| JP | 10-242449 | 9/1998 |

* cited by examiner

*Primary Examiner*—Eugene Lee
(74) *Attorney, Agent, or Firm*—Morrison & Foerster LLP

(57) ABSTRACT

A channel isolation region 42 is formed over the entire width of an N-type silicon substrate 41, and photothyristors, in each of which an anode diffusion region 43, a P-gate diffusion region 44, a cathode diffusion region 45 are formed parallel to the channel isolation region 42 over almost the entire width of the N-type silicon substrate 41, are formed in a left-hand portion 40a and in a right-hand portion 40b and are wired inversely parallel. Thus, the inter-channel movement of residual holes during commutation is restrained by the channel isolation region 42, by which commutation failure is suppressed to improve a commutation characteristic. Further, an operating current large enough for controlling a load current of approx. 0.2 A is obtained although a chip is divided by the channel isolation region 42. Therefore, using this bidirectional photothyristor chip makes it possible to implement an inexpensive SSR with a main thyristor eliminated.

20 Claims, 19 Drawing Sheets

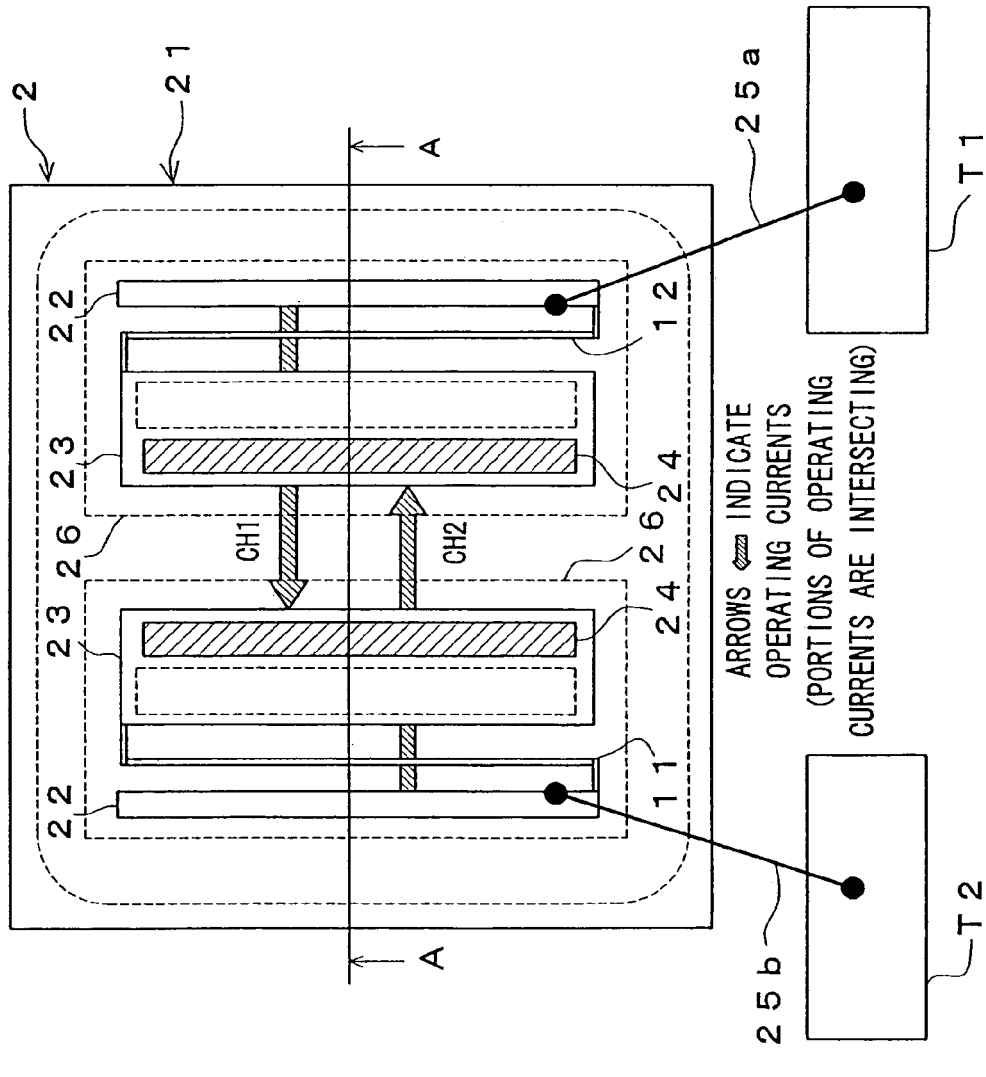

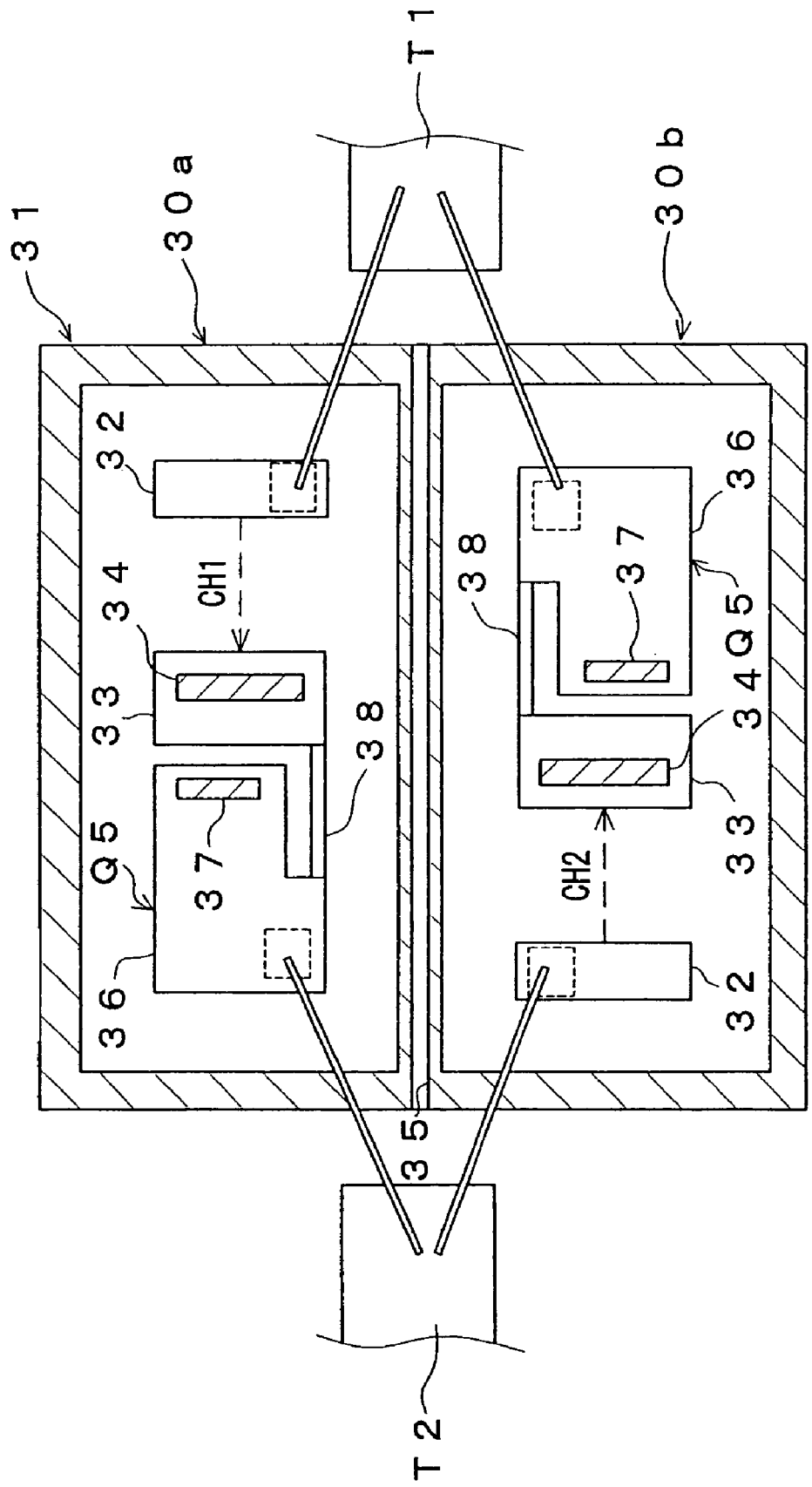
Fig.25 ---PRIOR ART---

US 7,157,747 B2

BIDIRECTIONAL PHOTOTHYRISTOR CHIP, LIGHT-FIRED COUPLER AND SOLID STATE RELAY

BACKGROUND OF THE INVENTION

The present invention relates to a bidirectional photothyristor chip, a light-fired coupler with use of the same, and a solid state relay (hereinafter abbreviated to SSR) with use of the light-fired coupler.

Conventionally, as a solid-state relay (hereinafter abbreviated to SSR) to be used with an alternating current, there has been a circuit construction as shown in FIG. 21. This SSR 8 is constituted of a light-fired coupler 3 constructed of a light-emitting device 1 such as an LED (light-emitting diode) and a bidirectional photothyristor 2 for firing, a bidirectional thyristor (hereinafter occasionally referred to as a main thyristor) 4 for actually controlling the load and a snubber circuit 7 constructed of a resistor 5, a capacitor 6 and so on.

An equivalent circuit diagram of the light-fired coupler 3 that constitutes the SSR 8 is shown in FIG. 22. The bidirectional photothyristor 2 is constructed of a photothyristor 9 of CH (channel) 1 and a photothyristor 10 of CH2. The photothyristor 9 of CH1 is constituted by connecting the base of a PNP transistor Q1 to the collector of an NPN transistor Q2 and connecting the collector of the PNP transistor Q1 to the base of the NPN transistor Q2. Likewise, the photothyristor 10 of CH2 is constituted by connecting the base of a PNP transistor Q3 to the collector of an NPN transistor Q4 and connecting the collector of the PNP transistor Q3 to the base of the NPN transistor Q4.

Further, on the CH1 side, the emitter of the PNP transistor Q1 is connected directly to an electrode T1. On the other hand, the emitter and the base of the NPN transistor Q2 are connected directly and via a gate resistor 11, respectively, to an electrode T2. Likewise, on the CH2 side, the emitter of the PNP transistor Q3 is connected directly to the electrode T2. On the other hand, the emitter and the base of the NPN transistor Q4 are connected directly and via a gate resistor 12, respectively, to the electrode T1.

FIG. 23 is a schematic pattern layout of the bidirectional photothyristor 2 of FIG. 22. FIGS. 24A and 24B are schematic sectional views taken along the arrow line A–A' in FIG. 23. FIG. 24A shows an optically turned-on state, and FIG. 24B shows an optically turned-off state during voltage inversion (during commutation). This bidirectional photothyristor 2 is provided with two anode diffusion regions (P-type) 22 and two P-gate diffusion regions (P-type) 23 on the front surface side of the N-type silicon substrate 21, which are laterally inverted to each other in the figure. A cathode diffusion region (N-type) 24 is provided on the side opposite from the anode diffusion region 22 in each of the P-gate diffusion regions 23. Thus, a PNPN section that constitutes the photothyristor 9 of CH1 in FIG. 22 is formed extended from the anode diffusion region 22 on the right-hand side toward the cathode diffusion region 24 on the left-hand side in the figure. Moreover, a PNPN section that constitutes the photothyristor 10 of CH2 is formed extended from the anode diffusion region 22 on the left-hand side toward the cathode diffusion region 24 on the right-hand side in the figure.

That is, the PNP transistor Q1 on the CH1 side is constructed of the anode diffusion region 22 on the right-hand side, the N-type silicon substrate 21 and the P-gate diffusion region 23 on the left-hand side, while the NPN transistor Q2 on the CH1 side is constructed of the cathode diffusion region 24, the P-gate diffusion region 23 both on the left-hand side and the N-type silicon substrate 21. On the other hand, the PNP transistor Q3 on the CH2 side is constructed of the anode diffusion region 22 on the left-hand side, the N-type silicon substrate 21 and the P-gate diffusion region 23 on the right-hand side, while the NPN transistor Q4 on the CH2 side is constructed of the cathode diffusion region 24, the P-gate diffusion region 23 both on the right-hand side and the N-type silicon substrate 21. The anode diffusion region 22 and the electrode T1 on the right-hand side are connected to each other by an Au wire 25a, while the cathode diffusion region 24 and the electrode T1 are connected to each other via an Al electrode 26 on the right-hand side inside the chip. Moreover, the anode diffusion region 22 and the electrode T2 on the left-hand side are connected to each other by an Au wire 25b, while the cathode diffusion region 24 and the electrode T2 are connected to each other via an Al electrode 26 on the left-hand side inside the chip.

The bidirectional photothyristor 2, which has the aforementioned construction, operates as follows. That is, in FIGS. 22 through 24A, firstly, if the potential polarity is more positive on the electrode T1 side than on the electrode T2 side under the condition that a power voltage higher than the on-state voltage (about 1.5 V) of the device is applied as a bias across the electrode T1 and the electrode T2, then the NPN transistor Q2 on the CH1 side is turned on when the bidirectional photothyristor 2 receives an optical signal from the LED 1. Then, a base current is drawn from the PNP transistor Q1 on the CH1 side, and this PNP transistor Q1 is turned on. Subsequently, a base current is supplied to the NPN transistor Q2 on the CH1 side by a collector current of the PNP transistor Q1, and the PNPN section on the CH1 side is turned on by positive feedback to flow an on-state current corresponding to the load of the AC circuit from the electrode T1 to the electrode T2. In the above case, the positive feedback of the PNPN section does not occur on the CH2 side since the bias applying direction is reversed, and only a primary photoelectric current flows.

On the other hand, if the potential polarity is more positive on the electrode T2 side than on the electrode T1 side, then the PNPN section on the CH2 side is turned on through positive feedback operation quite similarly to the above-mentioned case, and only the primary photoelectric current flows on the CH1 side.

Thus, when the PNPN section on the CH1 side or the PNPN section on the CH2 side performs the firing operation, this current flows into the gate of the main thyristor 4, firing the main thyristor 4. As a prior art reference concerning the bidirectional photothyristor for use in a light-fired coupler as described above, there is, for example, a patent gazette of Japanese Patent Laid-Open Publication No. HEI 10-242449.

In the circuit construction of the SSR 8 shown in FIG. 21, it is the main thyristor 4 that actually controls the load current, and the bidirectional photothyristor 2 is used for optically firing the main thyristor 4. Then, the SSR 8, which has the aforementioned circuit construction, has a feature that it is electrically insulated.

In designing a general SSR device, the bidirectional photothyristor 2 for firing is made to receive light from the LED 1 and become operative with a photoexcitation current of about 10 µA generated at the time. On the other hand, the main thyristor 4 becomes operative with a gate trigger current of about 20 mA, which is the operating current of the bidirectional photothyristor 2. Therefore, the main thyristor 4 cannot be fired at all by the photoexcitation current of the LED 1.

In the case of the aforementioned device, which has the bidirectional channels CH1 and CH2 inside the single chip and is used as a switch for an AC circuit, its commutation characteristic (described in detail later) is an important criterion for evaluating the device. Due to this commutation characteristic, the main thyristor 4 becomes unable to control (turning-off control) the load if it does not have a capacity exceeding the value of the current that is desired to be controlled, disadvantageously resulting in malfunctioning. Likewise, the bidirectional photothyristor 2 is to also malfunction due to the commutation characteristic if it does not have a capacity exceeding the trigger current of the main thyristor 4, the current value being about 50 mA.

Switches for alternating-current circuits having bidirectional channels CH1 and CH2 within one chip with the commutation characteristic improved include optical PNPN switches as shown in FIG. 25 (e.g., Japanese Patent Laid-Open Publication HEI 8-97403). In the optical PNPN switch, anode diffusion regions (p-type) 32 and p-gate diffusion regions (p-type) 33 opposed to the anode diffusion regions 32 are provided on the front surface side of an N-type silicon substrate 31 so as to be disposed in an upper portion 30a and a lower portion 30b in FIG. 25 in the state of being horizontally and vertically opposite to each other. In the both p-gate diffusion regions 33, 33, cathode diffusion regions (N-type) 34, 34 are provided. With this, a PNPN section is formed from the anode diffusion region 32 toward the cathode diffusion region 34 in each of the upper portion 30a and the lower portion 30b of the chip.

The upper portion 30a and the lower portion 30b of the chip are divided by a slit groove 35 having a depth D that extends from the front surface of the N-type silicon substrate 31 to a point inside the substrate. A flowing path of current from the right-side anode 32 to the cathode 34 in the upper portion 30a is set to CH1, while a flowing path of current from the left-side anode 32 to the cathode 34 in the lower portion 30b is set to CH2.

Further, phototransistors Q5, Q5 for increasing luminous sensitivity of CH1 and CH2 are provided on the both portions 30a and 30b of the chip. Each phototransistor Q5 is composed of a base diffusion region (p-type) 36 disposed across the p-gate diffusion region 33 from the anode diffusion region 32, an emitter diffusion region (n-type) 37 formed inside the base diffusion region 36 and an N-type silicon substrate 31 functioning as a collector. A base resistance (unshown) exists between the base diffusion region 36 and the emitter diffusion region 37 in each phototransistor Q5.

Further, a gate resistance (p-type) 38 is formed in between the p-gate diffusion region 33 of PNPN section and the base diffusion region 36 of the phototransistor Q5 on the upper portion 30a and the lower portion 30b of the chip. While the anode diffusion region 32 in the upper portion 30a and the base diffusion region 36 in the lower portion 30b are connected to a lead frame T1, the base diffusion region 36 in the upper portion 30a and the anode diffusion region 32 in the lower portion 30b are connected to a lead frame T2. Thus, the PNPN sections provided on the upper portion 30a and the lower portion 30b are wired inversely parallel, which implements switching of alternating current with one chip.

The above-structured optical PNPN switch operates as follows. First, an alternating voltage is applied to terminals T1 and T2. Here, the potential polarity on the terminal T1 side is more positive than that on the terminal T2 side. When light comes into the surface of the chip in this state, first the phototransistor Q5 in the upper portion 30a is put into ON state due to the contribution of a photoelectric current generated in the base diffusion region 36 of the phototransistor Q5. Consequently, a base current in an PNP transistor composed of the anode diffusion region 32, the N-type silicon substrate 31 and the p-gate diffusion region 33 in the upper portion 30a is drawn out, which sets the PNP transistor to ON state. Then, by a collector current of the PNP transistor, a base current is supplied to an NPN transistor composed of the N-type silicon substrate 31, the p-gate diffusion region 33 and the cathode diffusion region 34 in the upper portion 30a, which sets the NPN transistor to ON state. Eventually, the base current is supplied to the PNP transistor, so that the PNPN section on the CH1 side is put into ON state by positive feedback, by which an on-state current corresponding to the load of the alternating circuit flows from the terminal T1 to the terminal T2.

On the CH2 side, the positive feedback of the PNPN section does not occur since bias is applied in reverse direction, so that only a primary photoelectric current flows.

In the case where the potential polarity of the terminal T2 side is more positive than that on the terminal T1 side, the PNPN section on the CH2 side is put into ON state by the positive feedback operation quite similarly to the above-mentioned case, and only the primary photoelectric current flows on the CH1 side.

Between the PNPN section in the upper portion 30a and the PNPN section in the lower portion 30b on the N-type silicon substrate 31, a slit groove 35 is formed. Consequently, the slit groove 35 suppresses movement of holes, that are minority carriers in the N-type silicon substrate 31. Moreover, the side faces of the slit groove 35 achieve an effect of trapping and eliminating the holes. Accordingly, in the case where, for example, the PNPN section of the CH1 is set to OFF state (hereinafter simply stated as "CH1 is turned off": the same for the case of "ON state" and the case of CH2), it becomes difficult for the holes remaining in the N-type silicon substrate 31 on the CH1 side to move to the CH2 side. This restrains the malfunction (commutation failure) that the holes moved to the CH2 side promote positive feedback action of the CH2 side and thereby the CH2 is turned on, by which the commutation characteristic can be improved.

In recent years, the economic environment surrounding the electronic industry has become severer, and there are earnestly demanded cost reduction and improvement of handiness of electronic equipment. In order to cope with the above-mentioned demands, it has been attempted to directly control the load only by the bidirectional photothyristor with the main thyristor 4 eliminated as shown in FIG. 6 to, for example, reduce the parts count in the conventional SSR that has a construction as shown in FIG. 21.

In the above case, if a bidirectional photothyristor as shown in FIG. 23 or a switch for an alternating-current circuits as shown in FIG. 25 is employed as the bidirectional photothyristor 2, then there occurs the following problems.

First, in case that the bidirectional photothyristor as shown in FIG. 23 is employed, the commutation characteristic of this bidirectional photothyristor becomes the most serious problem. This commutation characteristic is an important design parameter, and the controllable load current is determined by this commutation characteristic.

The aforementioned commutation characteristic is herein described. With regard to the commutation characteristic in the case of normal operation, as shown in FIG. 24A, if the incidence of light disappears in a half cycle period of the alternating current during which the CH1 is on, then the on-state continues due to the current holding property of the PNPN section during this half cycle period. Then, if a shift to the next half cycle occurs as shown in FIG. 24B, then the CH2 is not turned on unless there is incident light. However, if an inductive load exists in the AC circuit that is subjected to switching, then the phase of the on-state voltage is delayed relatively to the phase of the AC voltage applied across the electrode T1 and the electrode T2. Therefore, an AC voltage of the inverted phase has already been applied across the electrode T1 and the electrode T2 at the point of time when the CH1 is turned off. Therefore, a voltage of the inverted phase exhibiting a steep rise is to be applied to the CH2 side at the point of time when the CH1 is turned off.

Therefore, holes 27, which remain in the N-type silicon substrate 21 of the bidirectional photothyristor 2, move to the P-gate diffusion region 23 on the right-hand side as indicated by arrow A before disappearing to thereby turn on the PNP transistor on the CH2 side despite no incident light and to promote the positive feedback on the CH2 side, causing a malfunction (commutation failure) that the CH2 is turned on.

That is, the aforementioned "commutation characteristic" is a characteristic that expresses a maximum operating current value Icom that can be controlled without causing the commutation failure as described above.

When the load is directly controlled only by the bidirectional photothyristor 2 with the main thyristor 4 eliminated in the conventional SSR that has a construction as shown in FIG. 21, there is required a capacity enough to endure a load current of about 0.2 A in terms of the capacity of bidirectional photothyristor 2. However, there is a problem that the main thyristor 4 cannot be eliminated since the commutation characteristic Icom required for the bidirectional photothyristor 2 is not smaller than about 200 mArms in the above case, and the malfunction due to the commutation failure occurs in the bidirectional photothyristor 2, shown in FIG. 23, which normally exhibits the commutation characteristic Icom of about one fifth the value.

Next, in the case of using switches for alternating-current circuits as shown in FIG. 25, the slit groove 35 is formed on the surface of the N-type silicon substrate 31 to divide the N-type silicon substrate 31 into the CH1 and the CH2. In each of the CH regions, the anode diffusion region 32, the p-gate diffusion region 33 opposed to the anode diffusion region 32 and the cathode diffusion region 34 provided inside the p-gate diffusion region 33 are formed in the direction vertical to the formation direction of the slit groove 35. Consequently, in each of the CH regions, the facing length of the anode diffusion region 32 and the cathode diffusion region 34 which face each other so that operating current flows therebetween is short. Eventually, although an operating current of about 150 mA to 200 mA can flow, the short facing length increases on-voltage VT, resulting in increased heating of the device. If the anode diffusion region and the cathode diffusion region should be formed so as to extend laterally, efficiency in terms of luminous sensitivity is degraded. Therefore, it is not possible to eliminate the main thyristor and directly control a load.

SUMMARY OF THE INVENTION

Accordingly, an object of the present invention is to provide a bidirectional photothyristor chip that has a function of optical firing and load control with a single chip and that enables a main thyristor of SSR to be eliminated, a light-fired coupler with use of the bidirectional photothyristor chip, and an SSR with use of the light-fired coupler.

In order to achieve the above object, there is provided a bidirectional photothyristor chip, comprising:

a first photothyristor portion and a second photothyristor portion formed away from each other on a surface of one semiconductor chip; and a channel isolation region formed on the surface of the semiconductor chip over almost the entire width thereof for separating a channel of the first photothyristor portion and a channel of the second photothyristor portion, the channel isolation region extending in a direction intersecting with the channel of the first photothyristor portion and the channel of the second photothyristor portion.

According to the above structure, during commutation, the channel isolation region restrains minority carriers in the substrate constituting the semiconductor chip from moving between the channels. As a consequence, when, for example, the channel of the first photothyristor portion is turned off, it becomes difficult for the carriers remaining in the substrate on the side of the first photothyristor portion to move to the side of the second photothyristor portion. This restrains a malfunction that the channel of the second photothyristor portion is turned on by positive feedback operation of the second photothyristor portion side, by which the commutation characteristic can be improved.

In this case, since the channel isolation region extends in the direction intersecting with the channel of the respective photothyristor portions, it becomes possible to form the anode diffusion region and the cathode diffusion region of the respective photothyristor portions over almost the entire width of the semiconductor chip along the channel isolation region. Therefore, it becomes possible to obtain an operating current large enough for controlling a load current although the semiconductor chip is divided into halves by the channel isolation region.

More specifically, using the bidirectional photothyristor chip as a light-fired coupler for the SSR allows omission of the main thyristor, making it possible to implement an inexpensive SSR with reduced parts count.

In one embodiment of the present invention, the respective photothyristor portions include a first diffusion layer that has a first conductive type and a second diffusion layer that has a second conductive type, and the respective diffusion layers are disposed in parallel with the channel isolation region with the channel isolation region interposed therebetween.

According to the above structure, during commutation, the channel isolation region restrains minority carriers in the substrate constituting the semiconductor chip from moving between the channels, thereby improving the commutation characteristic. In this case, it becomes possible to form the first diffusion layer and the second diffusion layer of the respective photothyristor portions over almost the entire width of the semiconductor chip along the channel isolation region. Therefore, it becomes possible to obtain an operating current large enough for controlling a load current although the semiconductor chip is divided into halves by the channel isolation region.

More specifically, using the bidirectional photothyristor chip as a light-fired coupler for the SSR allows omission of the main thyristor, making it possible to implement an inexpensive SSR with reduced parts count.

In one embodiment of the present invention, the first diffusion layer of the first photothyristor portion and the second diffusion layer of the second photothyristor portion are electrically connected to each other, while the second diffusion layer of the first photothyristor portion and the first diffusion layer of the second photothyristor portion are electrically connected to each other.

According to the above structure, during commutation, the channel isolation region restrains minority carriers in the substrate constituting the semiconductor chip from moving between the channels, thereby improving the commutation characteristic. In this case, it becomes possible to form the respective diffusion layers of the respective photothyristor portions over almost the entire width of the semiconductor chip along the channel isolation region. Therefore, it becomes possible to obtain an operating current large enough for controlling a load current although the semiconductor chip is divided into halves by the channel isolation region.

More specifically, using the bidirectional photothyristor chip as a light-fired coupler for the SSR allows omission of the main thyristor, making it possible to implement an inexpensive SSR with reduced parts count.

In one embodiment of the present invention, the channel isolation region is constituted of a dicing groove formed on the surface of the semiconductor chip.

In this case, in addition to an effect that the channel isolation region is simply formed, there is also obtained a secondary effect that minority carriers tend to be trapped on the dicing face, which ensures restraint of the minority carriers from moving between the channels during commutation by the dicing groove.

In one embodiment of the present invention, the semiconductor chip is constituted of an N-type silicon substrate, and the channel isolation region is constituted by including an oxygen doped semi-insulating polycrystalline silicon film doped with phosphorus formed on a surface of the N-type silicon substrate.

If the oxygen doped semi-insulating polycrystalline silicon film is doped with phosphorus, then the level in the oxygen doped semi-insulating polycrystalline silicon film is increased, and the silicon interface state (Qss) is consequently increased. Therefore, the holes of minority carriers in the N-type silicon substrate disappear in the channel isolation region, and the reduction in the hole lifetime is promoted. Thus, the movement of carriers between the channels during commutation is obstructed by the channel isolation region.

In one embodiment of the present invention, the semiconductor chip is constituted of an N-type silicon substrate, and the channel isolation region is constituted by including an oxygen-doped semi-insulating polycrystalline silicon film formed in contact with the surface of the N-type silicon substrate.

In the channel isolation region, the oxygen doped semi-insulating polycrystalline silicon film is formed in contact with the surface of the N-type silicon substrate. Therefore, the silicon interface state (Qss) of the channel isolation region is remarkably increased, and therefore, the reduction in the hole lifetime is further promoted.

In one embodiment of the present invention, the channel isolation region is constituted by including a short-circuit diode formed on the surface of the semiconductor chip.

In this case, the minority carriers in the substrate constituting the semiconductor chip are absorbed by the diffusion region of the short-circuit diode in the channel isolation region, and the lifetime of the minority carriers is reduced.

In one embodiment of the present invention, the respective photothyristor portions have an anode diffusion region and a cathode diffusion region, and the anode diffusion region is disposed closer to a side of the channel isolation region than the cathode diffusion region.

In this case, in the respective photothyristor portions, the channel is formed extended from the anode diffusion region disposed on the side of the channel isolation region toward the cathode diffusion region disposed on the opposite side of the channel isolation region. This prevents intersection of the channels and ensures their separation by the channel isolation region.

In one embodiment of the present invention, the respective photothyristor portions have an anode diffusion region, a gate photoreceptor diffusion region and a cathode diffusion region, and the gate photoreceptor diffusion region is disposed closer to a side of the channel isolation region than the anode diffusion region.

In this case, in the respective photothyristor portions, the channel is formed extended from the anode diffusion region disposed on the opposite side of the channel isolation region toward the cathode diffusion region formed within the gate photoreceptor diffusion region disposed on the side of the channel isolation region. This prevents the channels from intersecting each other and ensures their separation by the channel isolation region. Further, in the case where a light-fired coupler is formed in combination with a light emitting diode, the light emitting diode is disposed on the upper side of the central portion (i.e., the channel isolation region) of the bidirectional photothyristor chip. Consequently, the gate photoreceptor diffusion region disposed on the side of the channel isolation region is placed in the vicinity of the light emitting diode, which brings about light receiving characteristics better than those in the case where the anode diffusion region is disposed closer to the side of the channel isolation region than the cathode diffusion region.

In one embodiment of the present invention, the respective photothyristor portions include a PNPN section constituted of an anode diffusion region that has one conductive type out of N type and P type, a substrate that has the other conductive type out of N type and P type, a gate diffusion region that is opposed to the anode diffusion region and has the one conductive type, and a cathode diffusion region that is formed oppositely to the anode diffusion region inside the gate diffusion region and has the other conductive type, and a Schottky barrier diode is formed in between the gate diffusion region and the substrate, that constitute the PNPN section.

In this case, injection of minority carriers from the gate diffusion region to the substrate is suppressed and thereby an amount of residual carriers is decreased, which further improves the commutation characteristic in combination with the effects of the channel isolation region. Therefore, using the bidirectional photothyristor chip allows omission of the main thyristor, making it possible to implement an inexpensive SSR with reduced parts count more easily.

In one embodiment of the present invention, the Schottky barrier diode is opposed to the cathode diffusion region and is also formed with a length equal to that of the cathode diffusion region and with a prescribed width. Further, an area of the Schottky barrier diode is changed by changing the width of the Schottky barrier diode, and a forward voltage of the Schottky barrier diode is controllable by changing the area of the Schottky barrier diode.

In this case, a value of current flowing from the gate diffusion region, that is a base of the NPN transistor constituting the PNPN section, to the substrate that is a collector (corresponding to carrier injection which causes malfunction) is settable by the width of the Schottky barrier diode.

In one embodiment of the present invention, the width of the Schottky barrier diode is so set that a forward voltage of the Schottky barrier diode is lower by not smaller than 20 mV than the forward voltage between the gate diffusion region and the substrate.

In this case, if the forward voltage of the Schottky barrier diode is set to approx. 0.6V, that is a value lower by 20 mV than the forward voltage across the gate diffusion region and the substrate in the photothyristor portion, a current flowing from the gate diffusion region to the substrate is reduced by approx. 1 order of magnitude. This achieves further improvement of the commutation characteristic.

In one embodiment of the present invention, a distance between the two diffusion regions located with interposition of the Schottky barrier diode is set to a distance at which the Schottky barrier diode can effect pinch-off within its withstand voltage.

In this case, since the Schottky barrier diode can effect pinch-of within the withstand voltage thereof, high reliability is obtained without resulting in the destruction even in a use environment in which a maximum voltage of about 800 V is applied.

In one embodiment of the present invention, the respective photothyristor portions include a PNPN section constituted of an anode diffusion region that has one conductive type out of N type and P type, a substrate that has the other conductive type out of N type and P type, a gate diffusion region that is opposed to the anode diffusion region and has the one conductive type, and a cathode diffusion region that is formed oppositely to the anode diffusion region inside the gate diffusion region and has the other conductive type, a gate resistance and a switching device are connected in parallel in between a base and an emitter electrode of an NPN transistor which is constituted of the cathode diffusion region, the gate diffusion region and the substrate and also constitutes the PNPN section, and, a control terminal of the switching device is connected to a base of a PNP transistor which is constituted of the anode diffusion region, the substrate and the gate diffusion region and also constitutes the PNPN section.

In this case, in the vicinity of a zero cross point of the power voltage biased between the emitter electrode of the PNP transistor and the emitter electrode of the NPN transistor, the switching device is off, and a base-emitter voltage corresponding to a resistance value of the gate resistance is applied to the NPN transistor. While, at a point of time away from the zero cross point of the power voltage, the switching device is on, so that the connection from the base to the emitter of the NPN transistor is short-circuited, which prevents the NPN transistor from being turned on even if a light signal is received.

Thus, the zero cross function for turning the photothyristor portions on only in the vicinity of the zero cross point of the power voltage is obtained.

In one embodiment of the present invention, the semiconductor chip is constituted of an N-type silicon substrate, and on a back surface of the N-type silicon substrate, an $N^+$ layer doped with phosphorus at a concentration of not smaller than $10^{15}$ cm$^{-3}$ and not larger than $10^{18}$ cm$^{-3}$ is formed.

In this case, the $N^+$ layer on the back surface of the N-type silicon substrate is doped with phosphorus at a concentration of not smaller than $10^{15}$ cm$^{-3}$. Therefore, a critical off-state voltage increase rate dv/dt of not lower than 1000 V/µs required for the bidirectional photothyristor to correctly function as a device is obtained. Moreover, the $N^+$ layer is doped with phosphorus at a concentration of not greater than $10^{18}$ cm$^{-3}$. Therefore, it is possible to obtain a commutation characteristic Icom of not smaller than about 200 mArms required for the provision of an SSR that directly controls the load only by the bidirectional photothyristor with the main thyristor eliminated.

More specifically, the bidirectional photothyristor chip in the present embodiment makes it possible to implement an inexpensive SSR with the main thyristor eliminated and a parts count reduced without damaging luminous sensitivity.

In one embodiment of the present invention, the bidirectional photothyristor chip, further comprising at least any two of:

a construction of the channel isolation region in the above bidirectional photothyristor chip;

a construction of the PNPN section in the bidirectional photothyristor chip as claimed in claim 9 and a Schottky barrier diode; and a construction of the $N^+$ layer on the back surface of the N-type silicon substrate in the bidirectional photothyristor chip as claimed in claim 15.

According to the above construction, there is used the bidirectional photothyristor chip having a function equivalent to that of the main thyristor of the aforementioned SSR. Therefore, the light-fired coupler makes it possible to directly control a load in response to a light signal from the LED.

In one embodiment of the present invention, a light-fired coupler comprises the above bidirectional photothyristor chip and a light emitting diode.

According to the above construction, the light-fired coupler allowing direct control of a load in response to a light signal from the LED is used. This makes it possible to eliminate the main thyristor for controlling the load, thereby achieving an inexpensive SSR with reduced parts count.

As is clear from the foregoing description, the bidirectional photothyristor chip of the present invention is structured such that the channel isolation region formed on the surface of one semiconductor chip in the state of extending over almost the entire width of the semiconductor chip separates the channels of the respective photothyristor portions formed on the surface of the semiconductor chip. Consequently, the channel isolation region is capable of restraining inter-channel movement of minority carriers in the substrate constituting the semiconductor chip during commutation, which makes it possible to improve the commutation characteristic Icom up to approx. 200 mArms or more, that is required to implement the SSR that allows direct load control only with the bidirectional photothyristor.

Furthermore, the arrangement relationship between the channel isolation region and the channels and the respective diffusion layers in the respective photothyristor portions are arranged such that the diffusion region in the respective photothyristor portions may be formed over almost the entire width of the semiconductor chip along the channel isolation region. Therefore, by forming the diffusion region of each photothyristor portion over almost the entire width of the semiconductor chip along and parallel to the channel isolation region, it becomes possible to obtain an operating current large enough for withstanding a load current of approx. 0.2 A, that is necessary for directly controlling a load only with the bidirectional photothyristor although the semiconductor chip is divided into halves by the channel isolation region.

More specifically, using the bidirectional photothyristor chip as a light-fired coupler for the SSR allows omission of the main thyristor, making it possible to implement an inexpensive SSR with reduced parts count.

Moreover, since the light-fired coupler of the present invention is composed of the bidirectional photothyristor chip having a function equivalent to that of the main thyristor of the aforementioned SSR, the load of approx. 0.2 A can be directly controlled in response to a light signal from the LED.

Further, the SSR of the present invention is composed of the light-fired coupler and a snubber circuit, which makes it possible to eliminate the main thyristor for controlling a load, thereby achieving an inexpensive SSR with reduced parts count without damaging luminous sensitivity.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 23 is a schematic view showing the pattern layout of the bidirectional photothyristor in FIG. 22;

FIG. 25 is a plane view showing a conventional optical PNPN switch.

DETAILED DESCRIPTION OF THE PREFERRED EMBODIMENTS

This invention will be described in detail below on the basis of the embodiments with reference to drawings.

(First Embodiment)

Figure 1:
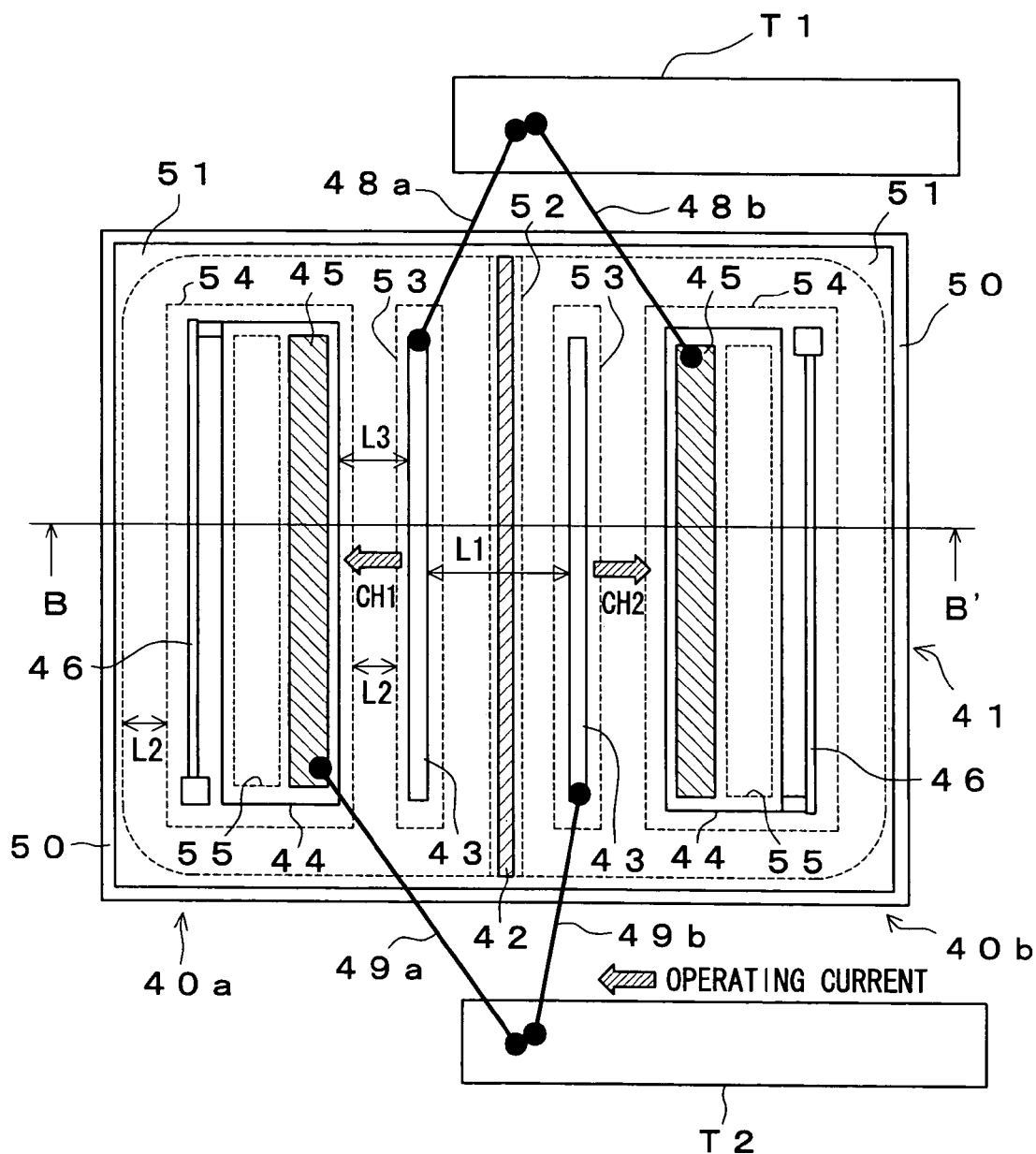
FIG. 1 is a view showing the schematic pattern layout of a bidirectional photothyristor chip of this invention.
Figure 2:
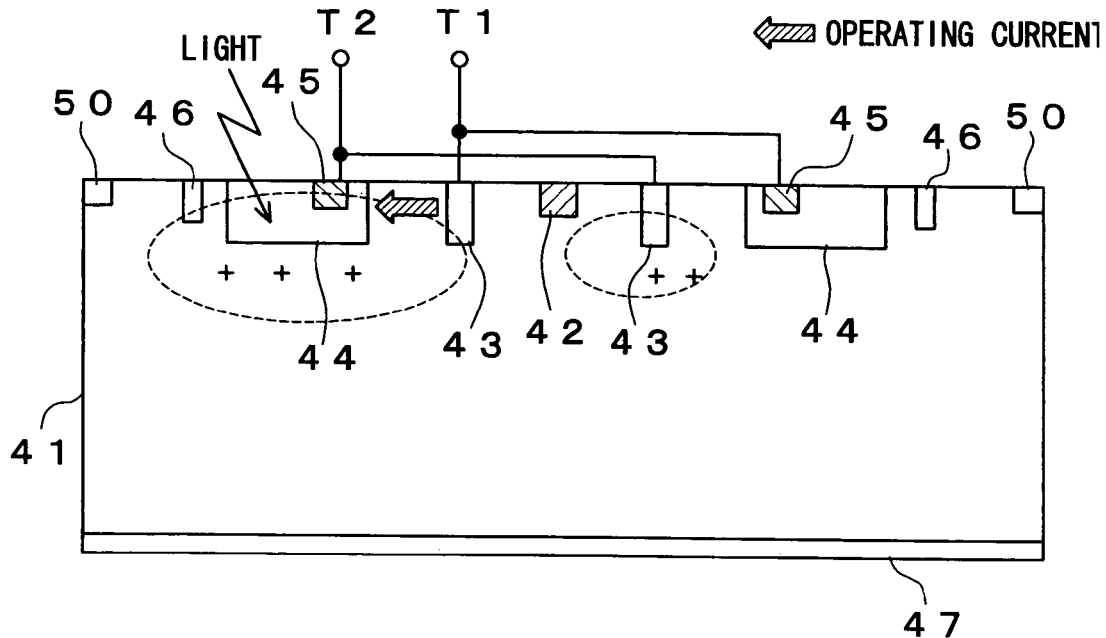
FIG. 2 is a schematic sectional view (optically turned-on state) taken along the arrow line B–B' in FIG. 1.
Figure 3:
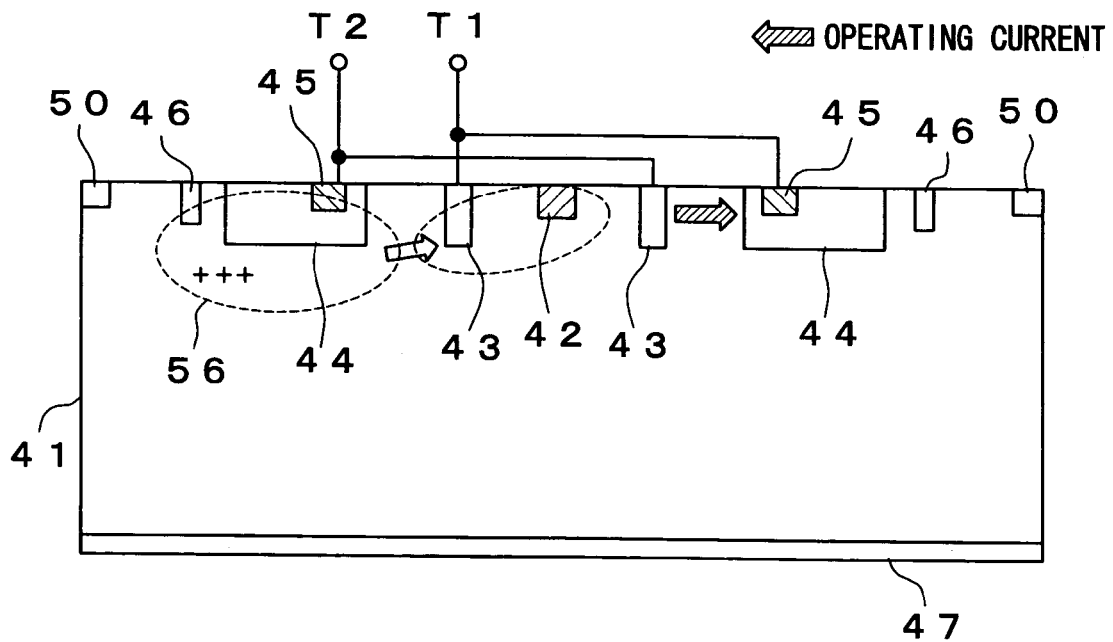
FIG. 3 is a schematic sectional view (during voltage inversion (during commutation)) taken along the arrow line B–B' in FIG. 1.

FIG. 1 shows a schematic pattern layout of the bidirectional photothyristor chip of the present embodiment, and FIG. 2 and FIG. 3 are sectional views taken along the arrow line B–B' in FIG. 1. It is to be noted that FIG. 2 shows optically turned-on state while FIG. 3 shows voltage inversed state (commutating state) in optically turned-off state.

As shown in FIG. 1, the bidirectional photothyristor chip in this embodiment has a channel isolation region 42 formed along one direction in the center of an N-type silicon substrate 41 constituting a chip. On the left-hand and right-hand sides of the channel isolation region 42 in the figure, photothyristors are disposed one by one. A distance L1 between these two photothyristors is set to 350 μm. It is to be noted that the distance L1 of 300 μm or longer is advantageous in terms of the separation of carriers, more specifically, the longer, the more advantageous, which, however, brings about such disadvantages as enlarged chip size (=increased cost) and degraded luminous sensitivity due to increase in distance from an LED mounted right thereabove in assembling of a light-fired coupler. Accordingly, optimization of the distance L1 is essential.

The respective photothyristors have following constructions. Hereinafter, for the sake of convenience, the region on the left-hand side of the channel isolation region 42 in the figure is referred to as a left-hand portion 40a, while the region on the right-hand side is referred to as a right-hand portion 40b.

First, as for the left-hand portion 40a, as shown in FIGS. 1 to 3, on the surface side of the N-type silicon substrate 41, an anode diffusion region (P-type) 43 and a P-gate diffusion region (P-type) 44 opposed to the anode diffusion region 43 are each formed over almost the entire width of the N-type silicon substrate 41 along and parallel to the channel isolation region 42. Further, in the P-gate diffusion region 44, along and parallel to a side that faces the anode diffusion region 43, a cathode diffusion region (N-type) 45 is formed on the side closer to the anode diffusion region 43. Thus, a PNPN section is formed extended from the anode diffusion region 43 toward the cathode diffusion region 45. It is to be noted that reference numeral 46 denotes a gate resistance.

Next, in the right-hand portion 40b, an anode diffusion region 43, a P-gate diffusion region 44, a cathode diffusion region 45 and a gate resistance 46 are formed in the state of being vertically and laterally inverted from the left-hand portion 40a with respect to the channel isolation region 42.

An impurity concentration of the N-type silicon substrate 41 is approx. $10^{14}$ cm$^{-3}$, an impurity concentration of the P-gate diffusion region 44 is approx. $10^{16}$ cm$^{-3}$ to $10^{18}$ cm$^{-3}$, and an impurity concentration of the cathode diffusion region 45 is approx. $10^{20}$ cm$^{-3}$ to $10^{21}$ cm$^{-3}$.

An N$^+$ layer 47 is formed by implanting phosphorus into the back surface of the N-type silicon substrate 41 to a concentration of $10^{16}$ cm$^{-3}$ by the ion implantation method. As described above, by forming the N$^+$ layer 47 by implanting phosphorus at a high concentration into the back surface of the N-type silicon substrate 41, reflection of carriers occurs in this N$^+$ layer 47, and a luminous sensitivity is increased by the effect of the so-called BSF (Back Surface Field) such that an equivalent lifetime is increased. If the back surface of the N-type silicon substrate 41 is made to remain N$^-$ (left intact as the N-type substrate) without adopting the above-mentioned structure, then the carriers easily recombine in the back surface of the N-type silicon substrate 31, and therefore, the equivalent lifetime is reduced.

Figure 22:
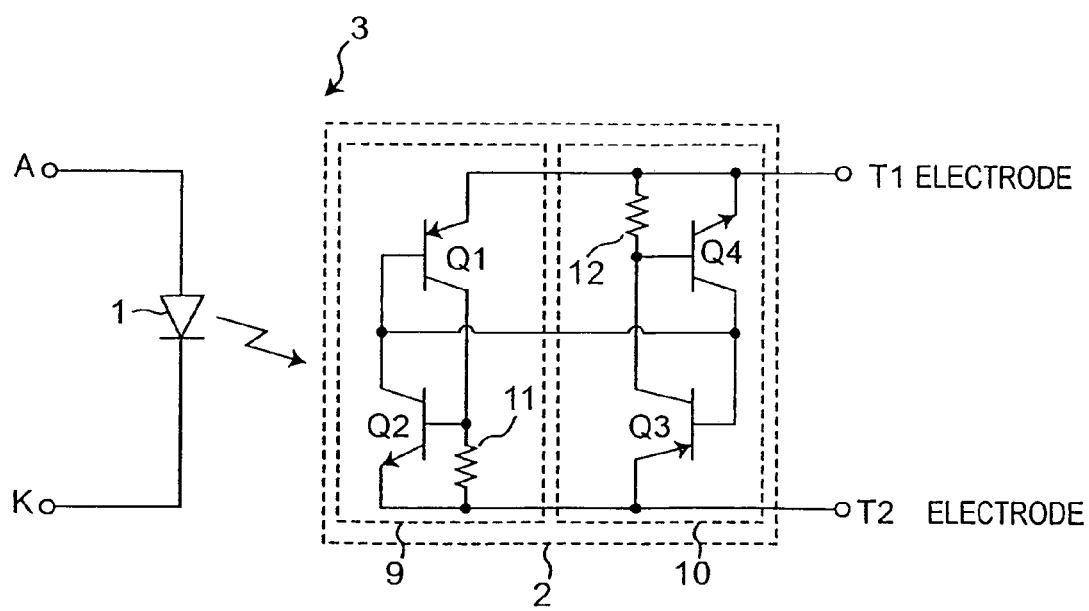
FIG. 22 is an equivalent circuit diagram of the light-fired coupler of FIG. 21.
Figure 24A:
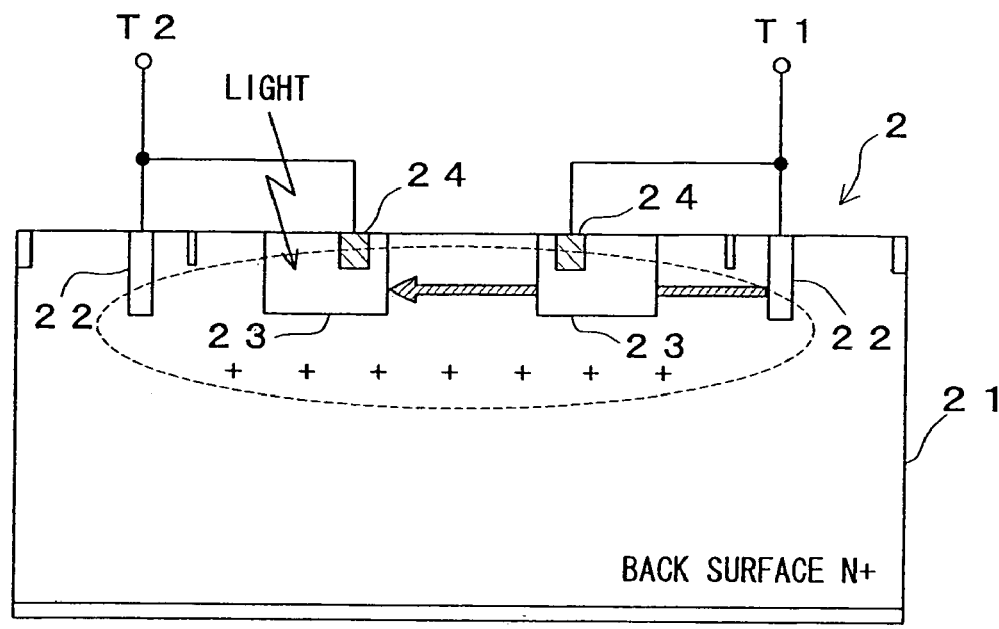
FIGS. 24A and 24B are sectional views taken along the arrow line A–A' in FIG. 23 for explaining the operation of the bidirectional photothyristor shown in FIG. 23.
Figure 24B:
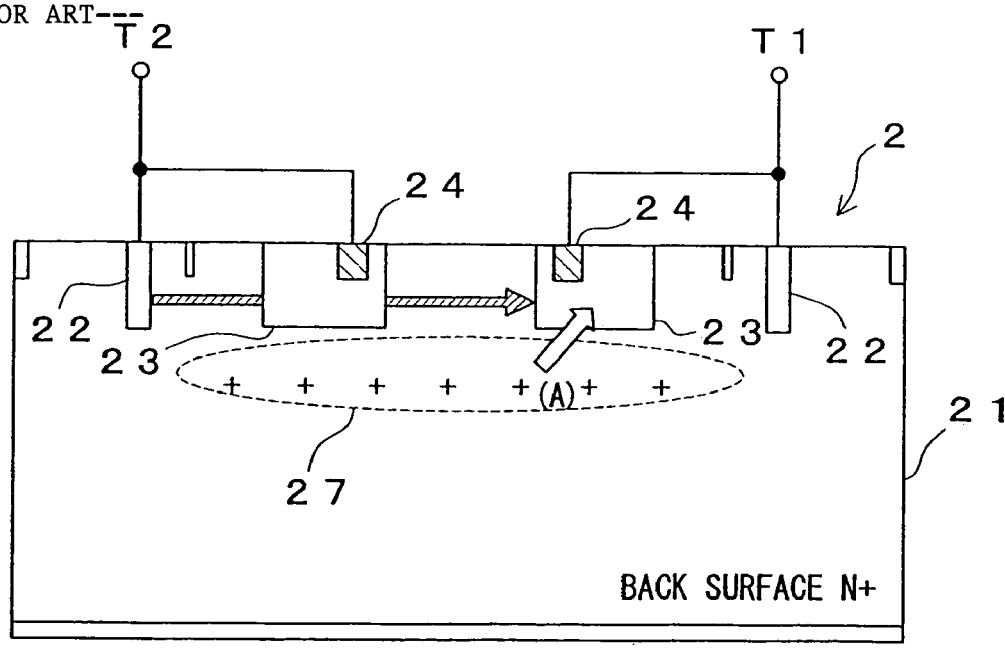

The latter is advantageous in terms of the commutation characteristic since the equivalent lifetime is small when designing constant of the equivalent circuit of the photothyristor as shown in FIG. 22, whereas the current amplification factor Hfe(pnp) of the PNP transistor is reduced to deteriorate the luminous sensitivity. In order to make compensation for this, it is required to increase the gate resistor 35 and the current amplification factor Hfe(npn) of the NPN transistor when designing the circuit constant, and this degrades the critical off-state voltage increase rate dv/dt, posing a problem that the principal characteristic of the device is not satisfied. The critical off-state voltage increase rate dv/dt characteristic also depends on the lifetime of the N-type silicon substrate 41. (1) In the case where the back surface is N$^-$, the hole lifetime $\tau_p$ is small, and the diffusion capacitance of the anode diffusion region 43 is reduced, consequently increasing the operative response speed of the PNP transistor and reducing the critical off-state voltage increase rate dv/dt. (2) In the case where the back surface is N$^+$, the hole lifetime $\tau_p$ is large, and the diffusion capacitance of the anode diffusion region 43 is increased, consequently reducing the operative response speed of the PNP transistor and increasing the critical off-state voltage increase rate dv/dt.

Accordingly, in order to satisfy the trade-off relation between this commutation characteristic and the critical off-state voltage increase rate dv/dt characteristic, it is required to optimize the phosphorus concentration in the back surface of the N-type silicon substrate 41 to set the characteristic of the current amplification factor Hfe(pnp) of the PNP transistor to an arbitrary circuit constant.

Herein, in the left-hand portion 40a in FIG. 1, a flow path of current from the anode diffusion region 43 on the right-hand side in the figure to the cathode diffusion region 45 on the left-hand side is referred to as CH (Channel) 1. In the right-hand portion 40b, a flow path of current from the anode diffusion region 43 on the left-hand side in the figure to the cathode diffusion region 45 on the right-hand side is referred to as CH2.

An N-type diffusion region 50 as a channel stopper is formed along the periphery of the chip. Further, as shown by a dashed line on the n-type diffusion region 50, an Al electrode 51 is formed. An Al 52 is also formed as shown by a dashed line on the channel isolation region 42. Further, on the left-hand portion 40a and the right-hand portion 40b, an Al electrode (shown by a dashed line) 53 is formed so as to cover the anode diffusion region 43, and an Al electrode (shown by a dashed line) 54 is formed so as to cover the P-gate diffusion region 44, the cathode diffusion region 45 and the gate resistance 46. It is to be noted that in the Al electrode 54, an aperture 55 is formed on a section of the P-gate diffusion region 44 on which the cathode diffusion region 45 is not formed, so as to serve as a light receiving portion. It is to be understood that the Al electrodes 51, 52, 53, 54 are omitted in FIG. 2 and FIG. 3.

The Al electrodes 53, 54, respectively, on the anode diffusion region 43 in the left-hand portion 40a and on the cathode diffusion region 45 in the right-hand portion 40b are connected to a lead frame T1 via Au wires 48a, 48b, while the Al electrodes 54, 53, respectively, on the cathode diffusion region 45 in the left-hand portion 40a and on the anode diffusion region 43 in the right-hand portion 40b are connected to a lead frame T2 via Au wires 49a, 49b. More specifically, the two thyristors in the left-hand portion 40a and the right-hand portion 40b are wired inversely parallel by wire bonding. As just described, by avoiding formation of wire connection on the N-type silicon substrate 41, the photothyristors can be formed over almost the entire width of the chip, which makes it possible to obtain an operating current large enough for controlling a load current of approx. 0.2 A although the chip is divided by the channel isolation region 42.

Further, the anode diffusion region 43 is disposed more inside than the cathode diffusion region 45, more specifically, between the CH1 and CH2. This brings about an effect of absorbing carriers, that remains after an applied voltage is inversed (commutated), in the anode diffusion region 43 of the opposite channel. In the case of giving priority to a design for increasing luminous sensitivity of the chip, the cathode diffusion region may be disposed more inside than the anode diffusion region.

As for passivation construction, detailed description will be given in the following embodiment. It is configured such that a polycrystalline silicon film doped with oxygen is formed on an oxide, and the both ends of the oxygen-doped polycrystalline silicon film are brought into contact with the Al electrodes to form potential gradient therebetween, which alleviates concentration of electric fields on the Si—SiO$_2$ interface. Thus, a field plate structure that is advantageously able to have a high withstand voltage is provided.

A bidirectional photothyristor chip, which has the aforementioned construction, operates as follows. That is, firstly, if the potential polarity is more positive on the lead frame T1 side than that on the lead frame T2 side under the condition that a power voltage higher than the on-state voltage of the device is applied as a bias across the lead frame T1 and the lead frame T2, then a large number of carriers (holes) are generated in the interface between the N-type silicon substrate 41 and the P-gate diffusion region 44 of an NPN transistor, that is composed of the N-type silicon substrate 41, the P-gate diffusion region 44 and the cathode diffusion region 45 in the left-hand portion 40a, when light from an LED and the like comes into the photothyristor in the left-hand portion 40a, as a result of which a photoelectric current is produced in the P-gate diffusion region 44. Then, due to the contribution of the photoelectric current, the NPN transistor in the left-hand portion 40a is turned on. Consequently, as shown in FIG. 2, a base current in a PNP transistor composed of the anode diffusion region 43, the N-type silicon substrate 41, and the P-gate diffusion region 44 in the left-hand portion 40a is drawn out, which turns the PNP transistor on. Then, a base current is supplied to the NPN transistor by a collector current of the PNP transistor, and the PNPN section in the left-hand portion 40a is turned on by positive feedback, by which an on-state current corresponding to the load of the alternating circuit flows from the lead frame T1 to the lead frame T2. In the right-hand portion 40b, the positive feedback of the PNPN section does not occur since bias is applied in reverse direction, so that only a primary photoelectric current flows.

In the case where the potential polarity of the lead frame T2 side is more positive than that on the lead frame T1 side, then the PNPN section in the right-hand portion 40b is turned on through positive feedback operation quite similarly to the above-mentioned case, and only the primary photoelectric current flows in the left-hand portion 40a.

On the N-type silicon substrate 41, a channel isolation region 42 is formed for separating the left-hand portion 40a and the right-hand portion 40b, on each of which one photothyristor composed of a PNPN section is formed. Consequently, as shown in FIG. 3, during commutation (the process through which the load current attenuates in response to an alternating voltage and the thyristor is thereby turned off in accordance with the timing of the holding current), holes 56 that are minority carriers in the N-type silicon substrate 41 are drawn in by the channel isolation region 42, so that the movement of the carriers between the channels is limited. Therefore, it is difficult for the holes remaining in the N-type silicon substrate 41 of the left-hand portion 40a to move to the right-hand portion 40b when, for example, the CH1 is turned off. This restrains a malfunction (commutation failure) that the positive feedback operation of the right-hand portion 40b turns CH2 on, and therefore the commutation characteristic can be improved.

As described before, the phosphorus concentration on the back surface of the N-type silicon substrate 41 should be optimized in order to satisfy a trade-off correlation between the commutation characteristic and the critical off-state voltage increase rate dv/dt characteristic. The following description discusses it in short.

Figure 4:
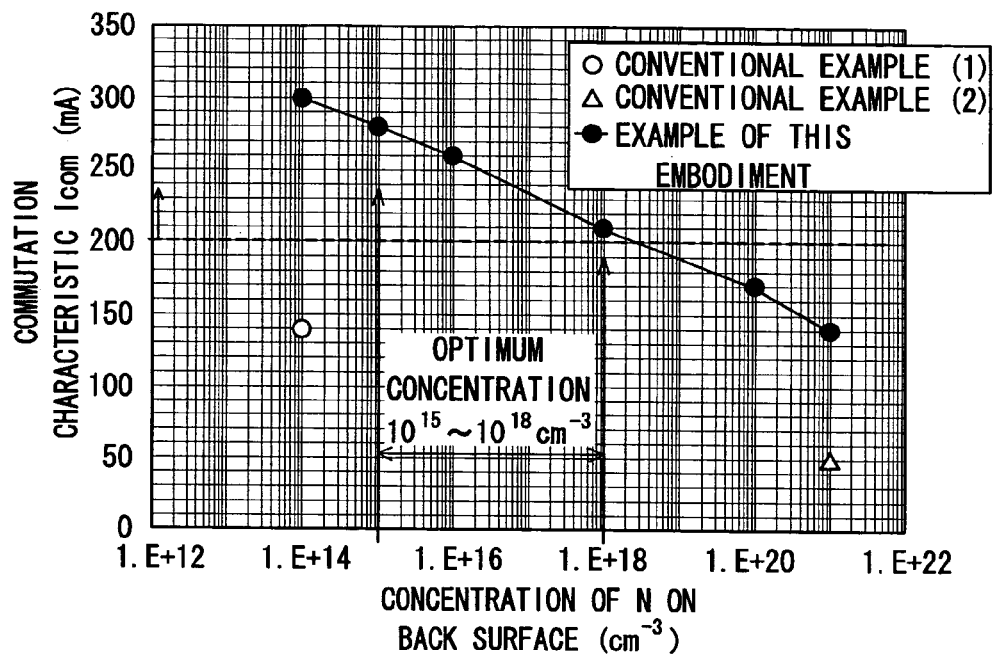
FIG. 4 is a view showing relation between an N-type impurity (phosphorus) concentration on the back surface of a substrate and a commutation characteristic.

FIG. 4 is a view showing relation between the N-type impurity (phosphorus) concentration on the back surface of the N-type silicon substrate 41 and the commutation characteristic that expresses a maximum operating current value Icom that can be controlled without causing the commutation failure. In the figure, filled circles denotes a plurality of examples in this embodiment, whereas an open circle and an open upward triangle denote comparative examples that are conventional bidirectional photothyristors without the channel isolation region 42. It is to be noted that an N-type impurity concentration of $10^{14}$ cm$^{-3}$ on the back surface of the substrate is equal to the N-type impurity concentration of the N-type silicon substrate 41 itself. According to FIG. 4, both in the examples of this embodiment and in the comparative examples, the commutation characteristic Icom tends to decrease as the N-type impurity concentration on the back surface of the substrates increases. For implementing an SSR that directly controls the load only by the bidirectional photothyristor with the main thyristor eliminated, the commutation characteristic Icom required for the bidirectional photothyristor is not smaller than about 200 mArms. As is clear from FIG. 4, therefore, the N-type impurity concentration on the back surface of the substrate in this embodiment is required to be not greater than $10^{18}$ cm$^{-3}$. It is to be noted that with the N-type impurity concentration of $10^{16}$ cm$^{-3}$, the commutation characteristic Icom of approx. 260 mArms was obtained.

Figure 5:
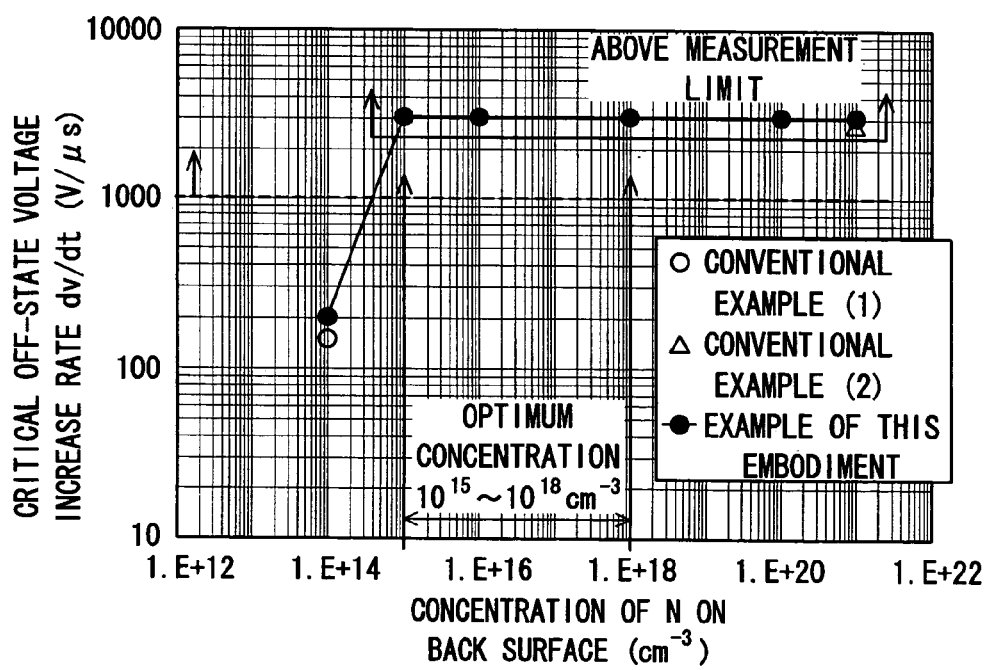
FIG. 5 is a view showing relation between the N-type impurity concentration on the back surface of the substrate and a critical off-state voltage increase rate.

FIG. 5 is a view showing relation between the N-type impurity concentration on the back surface of the substrate and the critical off-state voltage increase rate dv/dt. In the figure, filled circles denotes a plurality of examples in this embodiment, whereas an open circle and an open upward triangle denote comparative examples that are conventional bidirectional photothyristors without the channel isolation region 42. According to FIG. 5, both in the examples of this embodiment and in the comparative examples, the critical off-state voltage increase rate dv/dt tends to rise as the N-type impurity concentration increases. For the bidirectional photothyristor to function normally as a device, there is required a critical off-state voltage increase rate dv/dt of not lower than 1000 V/μs. As is clear from FIG. 5, therefore, the N-type impurity concentration on the back surface of the substrate in this embodiment is required to be not smaller than $10^{15}$ cm$^{-3}$.

As described above, in order to fulfill the requirement of both the commutation characteristic Icom and the critical off-state voltage increase rate dv/dt characteristic, which are in trade-off relation to each other, the N$^+$ layer 47 should preferably have a phosphorus concentration of not smaller than $10^{15}$ cm$^{-3}$ and not greater than $10^{18}$ cm$^{-3}$.

As described above, in this embodiment, in the center of the N-type silicon substrate 41 of the bidirectional photothyristor chip, the channel isolation region 42 is formed for separating the left-hand portion 40a and the right-hand portion 40b, on each of which one photothyristor composed of the PNPN section is formed. In this case, the anode diffusion region 43, the P-gate diffusion region 44 and the cathode diffusion region 45 constituting each photothyristor are respectively formed in parallel with the channel isolation region 42 so as to form a PNPN section extended from the anode diffusion region 43 toward the cathode diffusion region 45. This makes it possible to decrease the chance of excessive carriers remaining in the N-type silicon substrate 41 during commutation moving to the opposite channel side without the necessity of intersection of the operating current regions of the respective channels.

Further, a distance between the both anode diffusion regions 43 constituting the photothyristors in the left-hand portion 40a and the right-hand portion 40b is kept to be not smaller than 300 μm, and the anode diffusion regions 43 are disposed in between the CH1 and CH2. This makes it possible to obtain an effect of absorbing residual carriers during commutation in the anode diffusion region 43 of a counter channel.

Further, a field distance $L_2$, that is a distance between the Al electrode 53 covering the anode diffusion region 43 and the Al electrode 54 covering the P-gate diffusion region 44, the cathode diffusion region 45 and the gate resistance 46, and that is also a distance between the Al electrode 51 covering the n-type diffusion region 50 and the Al electrode 54, is set to not smaller than 50 μm. Therefore, a withstand voltage of 600V can be obtained. It is to be noted that a PNP base width $L_3$, that is a distance between the anode diffusion region 43 and the P-gate diffusion region 44, is optimized against on-voltage VT in the range of 120 μm to 300 μm. It is to be noted that a maximum value is determined by the field plate structure of voltage withstand design.

Further, the channel isolation region 42 is formed over the entire width of the N-type silicon substrate 41. The anode diffusion region 43, the P-gate diffusion region 44 and the cathode diffusion region 45 constituting each photothyristor are respectively formed over the entire width of the N-type silicon substrate 41 except a portion of the field distance $L_2$ in the state of being in parallel with the channel isolation region 42. Then, the two thyristors in the left-hand portion 40a and the right-hand portion 40b are wired reversely parallel by wire bonding. Therefore, it becomes possible to obtain an operating current large enough for controlling a load current of approx. 0.2 A although the chip is divided by the channel isolation region 42.

Figure 6:
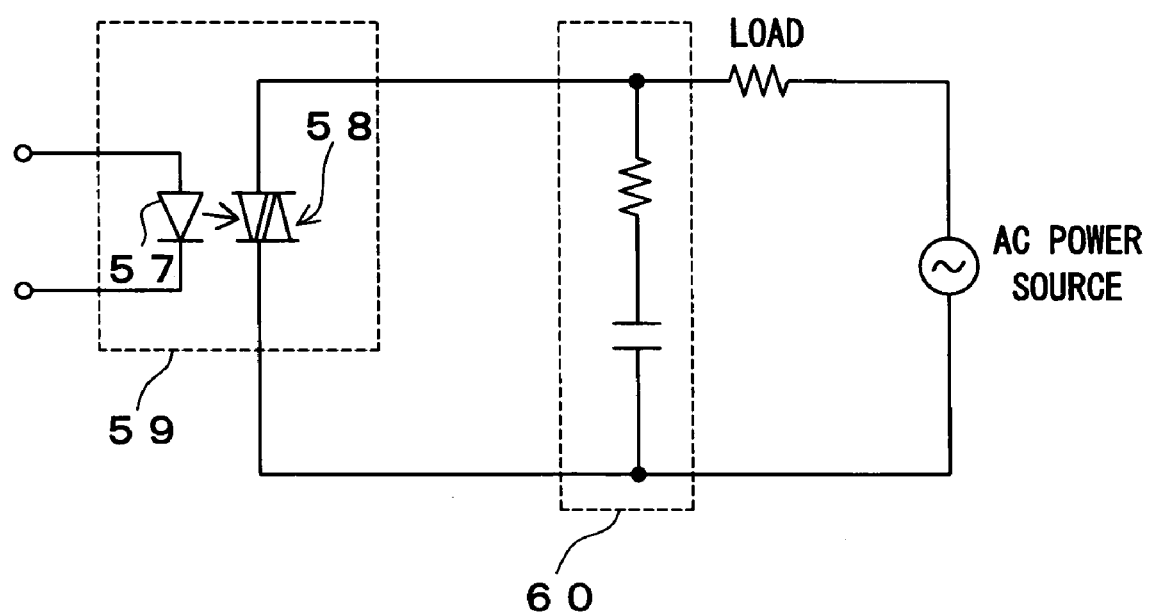
FIG. 6 is a circuit diagram of an SSR with use of a light-fired coupler including the bidirectional photothyristor chip shown in FIG. 1.

More specifically, the bidirectional photothyristor chip of the present embodiment can be controlled without malfunctioning with a load current up to about 0.2 A, and this means that the chip has a function equivalent to that of the main thyristor of the aforementioned SSR. Therefore, by employing the photothyristor chip of the present embodiment, it is possible to provide an inexpensive SSR, which has a reduced parts count and is made up of a light-fired coupler 59 for firing and load control constructed of an LED 57 and a bidirectional photothyristor chip 58 of the embodiment and a snubber circuit, by eliminating the main thyristor 4 as shown in the circuitry of FIG. 6.

Figure 7:
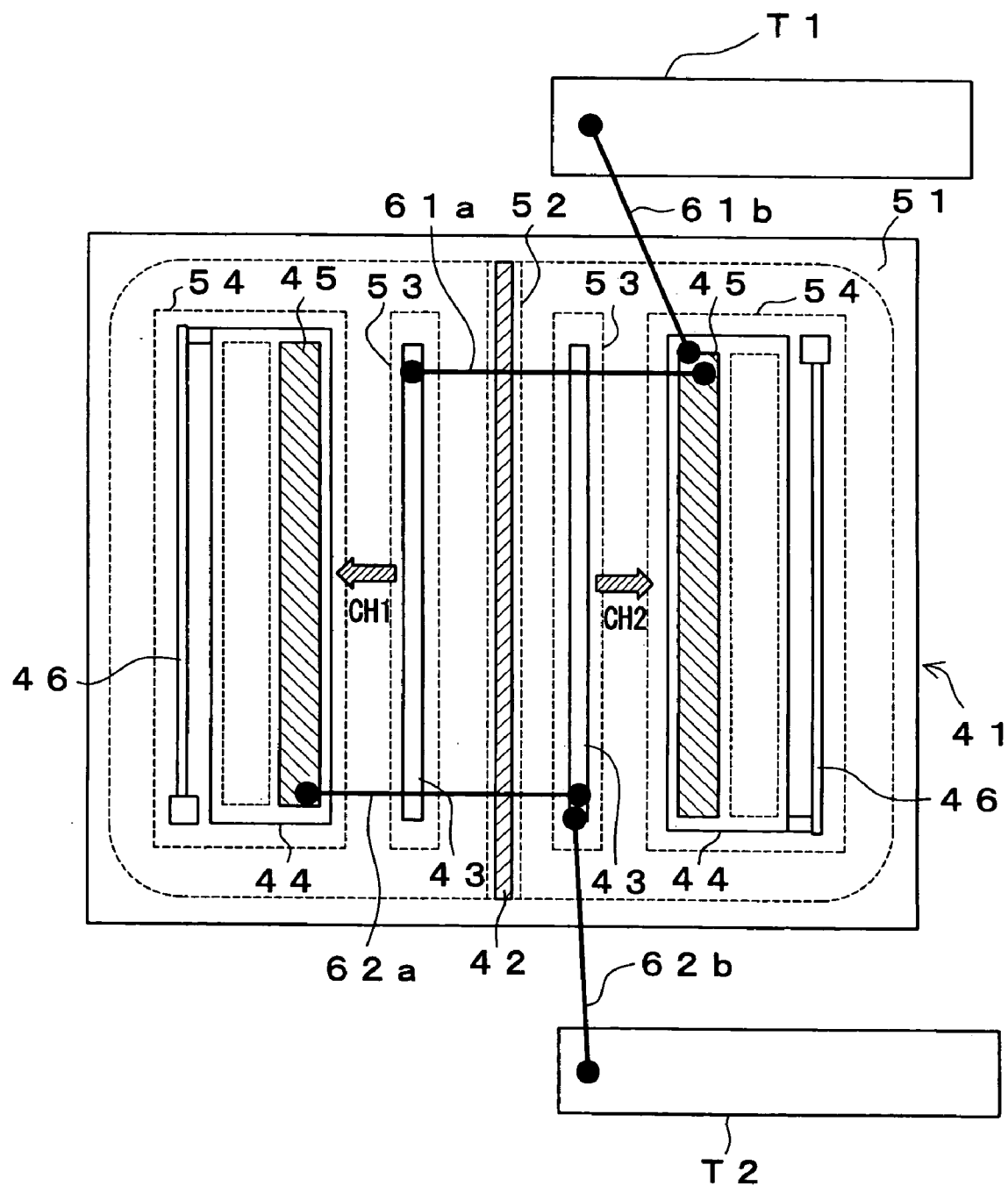
FIG. 7 is a view showing a method for connecting the bidirectional photothyristor chip to each lead frame different from the method shown in FIG. 1.

It is to be noted that in the bidirectional photothyristor chip shown in FIG. 1 to FIG. 3, the anode diffusion region 43 in the left-hand portion 40a and the cathode diffusion region 45 in the right-hand portion 40b are connected to the lead frame T1, while the cathode diffusion region 45 in the left-hand portion 40a and the anode diffusion region 43 in the right-hand portion 40b are connected to the lead frame T2. However, without being limited thereto, the method for connecting to the respective lead frames T1, T2 in the bidirectional photothyristor chip may include the method shown in FIG. 7.

More specifically, the Al electrodes 53, 54, respectively, on the anode diffusion region 43 in the left-hand portion 40a and on the cathode diffusion region 45 in the right-hand portion 40b are connected by an Au wire 61a, and further the Al electrode 54 in the right-hand portion 40b is connected to the lead frame T1 via an Au wire 61b. Meanwhile, the Al electrodes 54, 53, respectively, on the cathode diffusion region 45 in the left-hand portion 40a and on the anode diffusion region 43 in the right-hand portion 40b are connected by an Au wire 62a, and further the Al electrode 53 in the right-hand portion 40b is connected to the lead frame T2 via an Au wire 62b.

Further, in the bidirectional photothyristor chip shown in FIG. 1 to FIG. 3, the anode diffusion region 43, the P-gate diffusion region 44 and the cathode diffusion region 45 formed in sequence from the channel isolation region 42 side give the respective photothyristors a current flow (CH: channel) from the anode diffusion region 43 positioned on the channel isolation region 42 side to the cathode diffusion region 45 positioned outside.

Figure 8:
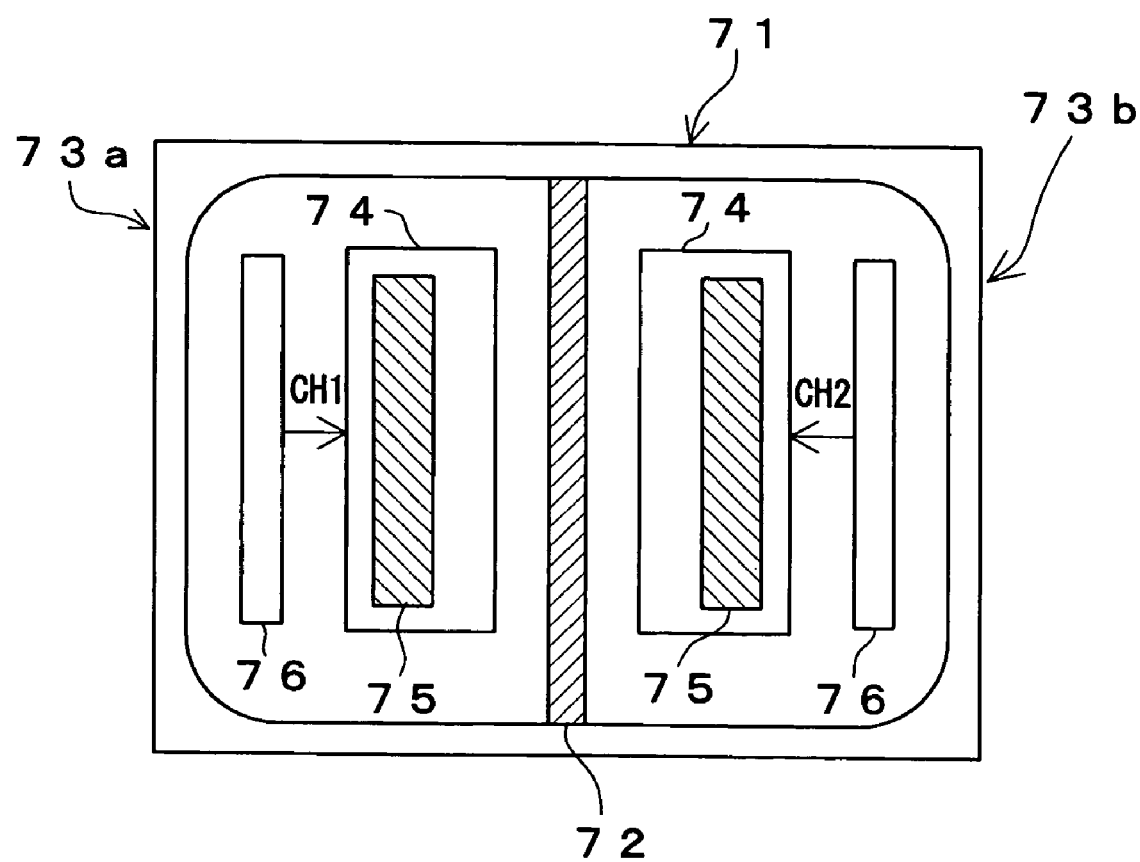
FIG. 8 is a view showing the schematic pattern layout of a bidirectional photothyristor chip different from that of FIG. 1 through FIG. 3.

Alternatively, as shown in FIG. 8, in each left-hand portion 73a and right-hand portion 73b divided by a channel isolation region 72 formed in the center of an N-type silicon substrate 71 over the entire width of the chip, a P-gate diffusion region 74 formed along and parallel to the channel isolation region 72, a cathode diffusion region 75 formed on the side opposite to the channel isolation region 72 within the P-gate diffusion region 74, and an anode diffusion region 76 formed so as to face the cathode diffusion region 75 constitute a photothyristor composed of a PNPN section. Then, a current flow (CH: channel) is formed extended from the anode diffusion region 76 positioned outside toward the cathode diffusion region 75 positioned on the channel isolation region 72 side.

In this case, like the case of the bidirectional photothyristor chip shown in FIG. 1 to FIG. 3, the channel isolation region 72 makes it possible to restrain holes that are minority carriers in the N-type silicon substrate 71 during commutation from moving between the channels. Therefore, it becomes possible to suppress commutation failure and improve the commutation characteristic.

Moreover, it becomes possible to decrease the chance of excessive carriers remaining in the N-type silicon substrate 71 during commutation moving to the opposite channel side without operating current regions of the respective channels being crossed each other. Also, the P-gate diffusion region 74, the cathode diffusion region 75 and the anode diffusion region 76 constituting each photothyristor are formed over the entire width of the N-type silicon substrate 71 except a portion of the field distance $L_2$, which makes it possible to obtain an operating current large enough for controlling a load current of approx. 0.2 A. This allows implementation of an inexpensive SSR with reduced parts count by eliminating the main thyristor.

According to this embodiment, in the photothyristors in the left-hand portions 40a, 73a and the photothyristors in the right-hand portions 40b, 73b, the anode diffusion regions 43, 76 and the cathode diffusion regions 45, 74 are arranged in the direction orthogonal to the channel isolation regions 42, 72 in the order opposite to each other (more specifically, arranged symmetrically about the channel isolation regions 42, 72). However, the present invention may bring about the same effect even if they are arranged in the same order.

(Second Embodiment)

Figure 9:
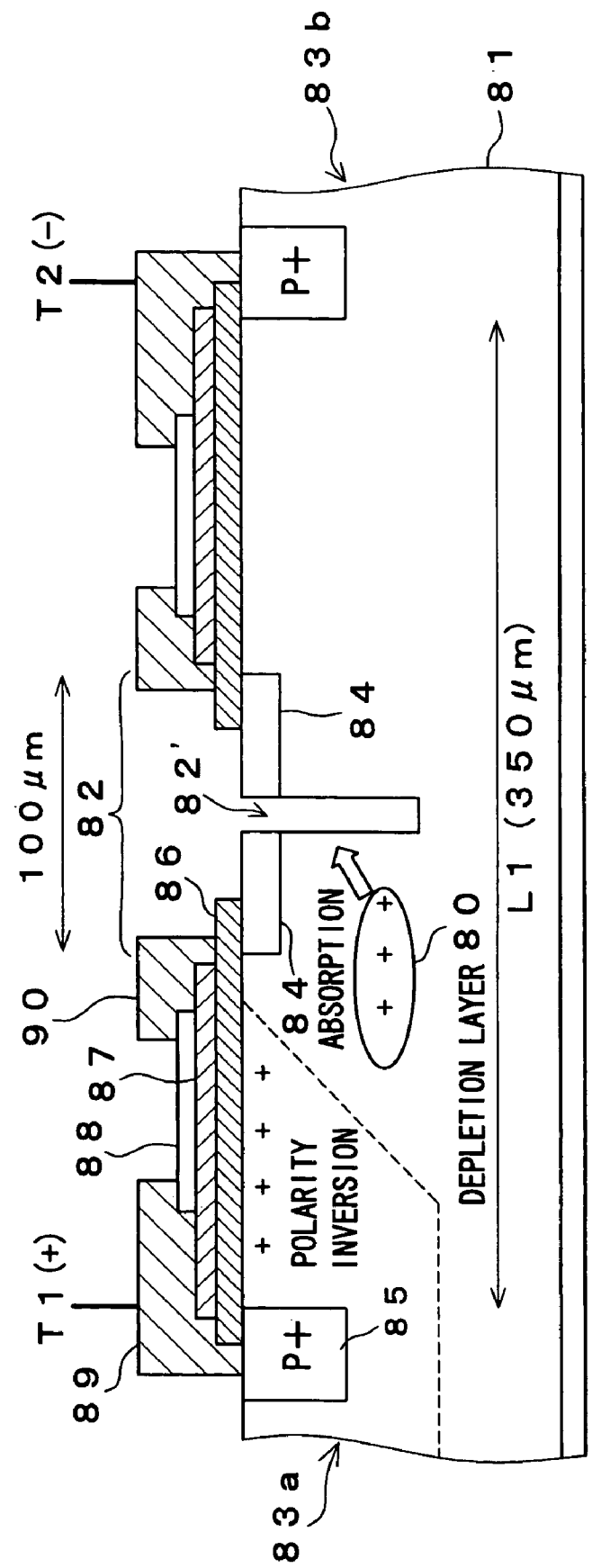
FIG. 9 is a sectional view showing a concrete construction of a channel isolation region in FIG. 1 and FIG. 8.

The following description discusses the concrete construction of the channel isolation regions 42, 72. FIG. 9 is a sectional view of an N-type silicon substrate 81 in the vicinity of a channel isolation region 82 showing the passivation structure of this embodiment. The channel isolation region 82 in this embodiment is composed of a dicing groove 82' with a depth of 100 μm formed in the N-type silicon substrate 81. With the dicing groove 82' formed between the PNPN portion in a left-hand portion 83a and the PNPN portion in a right-hand portion 83b, holes 80 that are minority carriers in the N-type silicon substrate 81 are restrained from moving. Further, the lateral faces of the dicing groove 82' are rough, so that the holes 80 are easily trapped, bringing about an effect of recombining and eliminating the holes 80 on the dicing face. Therefore, it becomes difficult for the holes 80 remaining in the N-type silicon substrate 81 in the left-hand portion 83a to move to the right-hand portion 83b when, for example, CH1 is turned off. As a result, the malfunction (commutation failure) that CH2 is turned on by the positive feedback action of the right-hand portion 83b is suppressed, by which the commutation characteristic can be improved.

Further, an N-type diffusion region 84 as a channel stopper with its lateral face facing the dicing groove 82' is formed respectively in the left-hand portion 83a and the right-hand portion 83b of the dicing groove 82', and an $SiO_2$ film 86 is formed on the N-type silicon substrate 81 extending over an anode diffusion region 85 toward the N-type diffusion region 84. Further, an oxygen doped semi-insulating polycrystalline silicon film 87 is formed on the $SiO_2$ film 86, and further on the oxygen doped semi-insulating polycrystalline silicon film 87, an SiN film 88 is formed by the chemical vapor deposition method. On one end side of the oxygen doped semi-insulating polycrystalline silicon film 87, an Al electrode 89 is formed over the anode diffusion region 85 to the SiN film 88, and is connected to a lead frame T1 or a lead frame T2. On the other end portion of the oxygen doped semi-insulating polycrystalline silicon film 87, an Al electrode 90 is formed over the $SiO_2$ film 86 to the SiN film 88, and is connected to the N-type silicon substrate 81. By thus bringing the both ends of the oxygen doped semi-insulating polycrystalline silicon film 87 in contact with the Al electrodes 89 and 90 for the formation of a potential gradient between both the Al electrodes 89 and 90, the concentration of electric fields on the Si—SiO$_2$ interface is alleviated. Thus, a field plate structure that is advantageously able to have a high withstand voltage is provided.

It is to be noted that the depth of the dicing groove 82' is not limited to the above-stated 100 μm. If the depth of the dicing groove 82' is not smaller than 10 μm and not larger than ⅔ of a chip thickness, the aforementioned effect may be achieved without causing breakage of the N-type silicon substrate 81 during dicing operation. Moreover, although a distance L1 between the channels, that is a distance between the anode diffusion region 85 in the left-hand portion 83a and the anode diffusion region 85 in the right-hand portion 83b is set to 350 μm, it is advantageous for the distance to be 300 μm or longer in terms of the separation of carriers, more specifically, the longer, the more advantageous. It is to be noted that the rightsizing of the distance is required because the chip size is increased. Moreover, although the width of the channel isolation region 82, or the outermost width between the N-type diffusion region 84 in the left-hand portion 83a and the N-type diffusion region 84 in the right-hand portion 83b is set to 100 μm, the width is required to be not smaller than 50 μm.

(Third Embodiment)

Figure 10:
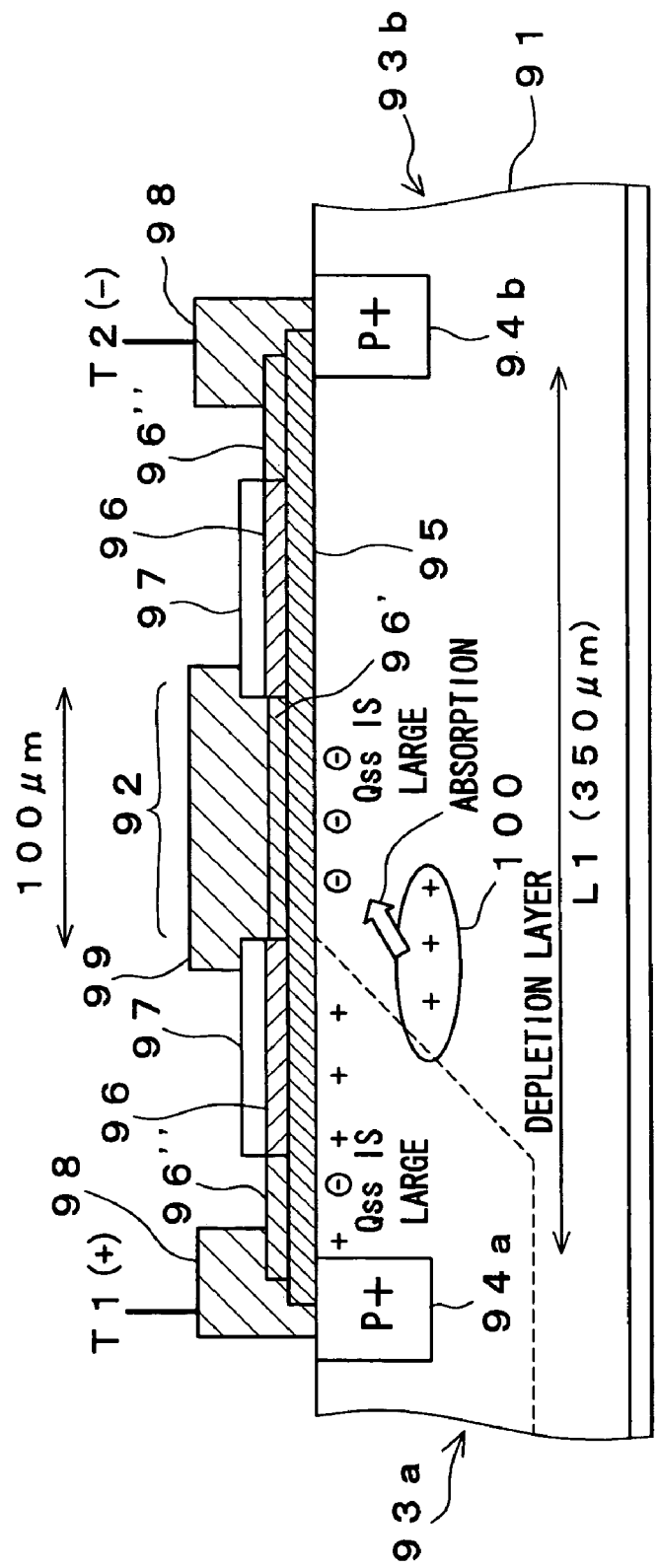
FIG. 10 is a sectional view showing the construction of a channel isolation region different from that of FIG. 9.

FIG. 10 is a sectional view of an N-type silicon substrate 91 in the neighborhood of the channel isolation region 92 showing the passivation structure of the present embodiment. A channel isolation region 92 in the present embodiment is constructed of an oxygen doped semi-insulating polycrystalline silicon film doped with phosphorus formed on the N-type silicon substrate 91. If the oxygen doped semi-insulating polycrystalline silicon film is doped with phosphorus, the level of the oxygen doped semi-insulating polycrystalline silicon film is increased, and the silicon interface state (Qss) consequently increases. Therefore, holes of minority carriers in the N-type silicon substrate 91 can be made to positively disappear, and the reduction in the lifetime of holes can be promoted.

An SiO$_2$ film 95 is formed over an anode diffusion region 94a of a left-hand portion 93a to an anode diffusion region 94b of a right-hand portion 93b in the left-hand portion 93a and the right-hand portion 93b of the channel isolation region 92 on the N-type silicon substrate 91. Further, an oxygen doped semi-insulating polycrystalline silicon film 96 is formed on this SiO$_2$ film 95, and a region 96' in the neighborhood of the channel isolation region 92 of the oxygen doped semi-insulating polycrystalline silicon film 96 and regions 96" in both end portions are doped with phosphorus. With this arrangement, the silicon interface state Qss is increased in the region 96' of the channel isolation region 92 on the surface of the N-type silicon substrate 91 and the regions 96" in both end portions.

Further, an SiO$_2$ film 97 is formed on a region that is not doped with phosphorus in the oxygen doped semi-insulating polycrystalline silicon film 96 by the chemical vapor deposition method. Then, an Al electrode 98 is formed over the anode diffusion region 94 to the oxygen doped semi-insulating polycrystalline silicon film 96" in the positions of both end portions 96" doped with phosphorus in the oxygen doped semi-insulating polycrystalline silicon film 96 and connected to a lead frame T1 or a lead frame T2. On the other hand, an Al electrode 99 is formed over an SiO$_2$ film 97 of the left-hand portion 93a to an SiO$_2$ film 97 of the right-hand portion 93b in the region 96' doped with phosphorus in the oxygen doped semi-insulating polycrystalline silicon film 96 and connected to the N-type silicon substrate 91. By thus bringing both the ends and the center portion of the oxygen doped semi-insulating polycrystalline silicon film 96 in contact with the Al electrodes 98 and 99 for the formation of a potential gradient between both the Al electrodes 98 and 99, the concentration of electric fields on the Si—SiO$_2$ interface is alleviated. Thus, a field plate structure is formed also in the present embodiment.

With the above-mentioned arrangement, the silicon interface state Qss in the position of the channel isolation region 92 on the surface of the N-type silicon substrate 91 is increased. Therefore, holes 100 of minority carriers in the N-type silicon substrate 91 are made to disappear in the channel isolation region 92, and the movement of holes between channels is limited.

Further, the oxygen doped semi-insulating polycrystalline silicon film 96 on the anode diffusion region 94 is doped with phosphorus. Therefore, the silicon interface state Qss in the neighborhood of the channel isolation region 92 of the anode diffusion region 94 on the surface of the N-type silicon substrate 91 is increased, and the current amplification factor Hfe(pnp) of the PNP transistor including the anode diffusion region 94 is reduced. As a result, a holding current (hereinafter referred to as IH) is increased to 500 μA or more and the time during which the on-state of the PNPN section continues becomes long. This provides a time delay to the occurrence of the malfunction during the commutation and allows the more effective disappearance of carriers that move to the opposite channel.

The method for increasing the IH to 500 μA or more is not limited to the aforementioned (1) reduction in the current amplification factor Hfe(pnp) of the PNP transistor and can also be achieved by (2) increasing the area ratio of the cathode diffusion area with respect to the P-gate diffusion area or (3) reducing the current amplification factor Hfe (npn) of the NPN transistor or the gate resistance value.

The higher the concentration of phosphorus implanted into the oxygen doped semi-insulating polycrystalline silicon film 96, the more the silicon interface state Qss increases, which is effective for the improvement of the commutation characteristic. However, there is an adverse influence exerted on the inherent reliability and so on of the device if the concentration is too high, and therefore, a sheet resistance of not lower than 1 Ω/□ and not higher than 2000 Ω/□ is appropriate. Moreover, although the distance L2 between the channels is set to 350 μm, it is advantageous for the distance to be 300 μm or longer in terms of the separation of carriers. It is to be noted that the rightsizing of the distance is required because the chip size is increased. Moreover, although the width of the channel isolation region 92, or the width of the phosphorus doped region 96' of the oxygen doped semi-insulating polycrystalline silicon film 96 located at the boundary between the left-hand portion 93a and the right-hand portion 93b is set to 100 μm, the width is required to be not smaller than 50 μm.

Moreover, the Al electrode 99 formed in the position of the channel isolation region 92 can function also as a light shading film.

(Fourth Embodiment)

Figure 11:
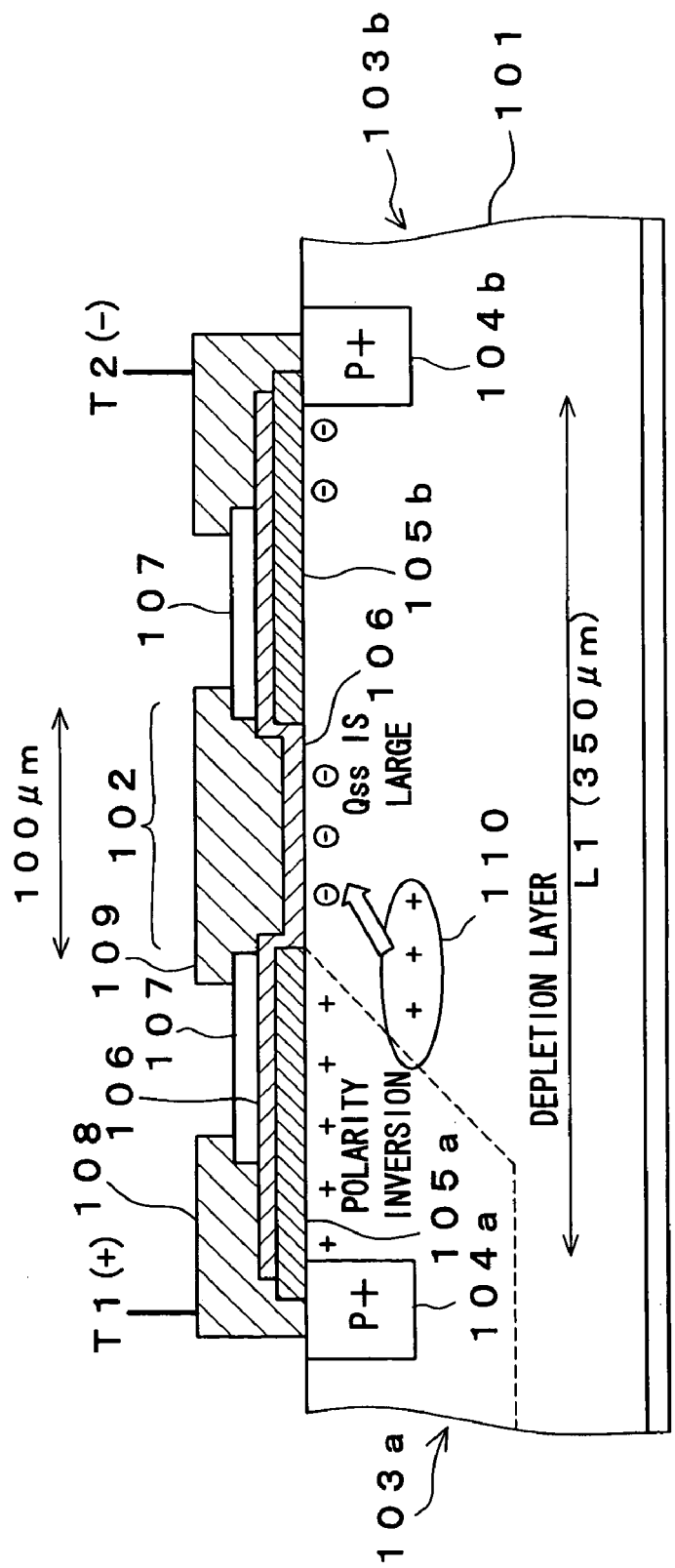
FIG. 11 is a sectional view showing the construction of a channel isolation region different from those in FIG. 9 and FIG. 10.

FIG. 11 is a sectional view of an N-type silicon substrate 101 in the neighborhood of the channel isolation region 102 showing the passivation structure of the present embodiment. The channel isolation region 102 of the present embodiment is constituted by directly forming an oxygen doped semi-insulating polycrystalline silicon film on the surface of an N-type silicon substrate 101.

An SiO$_2$ film 105 is formed over an anode diffusion region 104a of a left-hand portion 103a to an anode diffusion region 104b of a right-hand portion 103b in the left-hand portion 103a and the right-hand portion 103b of the channel isolation region 102 on an N-type silicon substrate 101. Then, an SiO$_2$ film 105 in the portion of the channel isolation region 102 is removed to expose the N-type silicon substrate 101. In the above-mentioned state, an oxygen doped semi-insulating polycrystalline silicon film 106 is formed over an anode diffusion region 104a of an SiO$_2$ film 105a of a left-hand portion 103a to an anode diffusion region 104b of an SiO$_2$ film 105b of a right-hand portion 103b. Thus, the oxygen doped semi-insulating polycrystalline silicon film 106 is directly formed in contact with the surface of the N-type silicon substrate 101 in the channel isolation region 102.

Further, an SiO$_2$ film 107 is formed on the oxygen doped semi-insulating polycrystalline silicon film 106 in the region on the SiO$_2$ film 105 by the chemical vapor deposition method. Then, an Al electrode 108 is formed over the surface of the anode diffusion region 104 to the surface of the SiO$_2$ film 107 and connected to a lead frame T1 or a lead frame T2. On the other hand, an Al electrode 109 is formed over the surface of the SiO$_2$ film 107 of the left-hand portion 103a to the surface of the SiO$_2$ film 107 of the right-hand portion 103b and connected to the N-type silicon substrate 101. By thus bringing the end portions and the center portion of the oxygen doped semi-insulating polycrystalline silicon film 106 in contact with the Al electrodes 108 and 109 for the formation of a potential gradient between both the Al electrodes 108 and 109, the concentration of electric fields on the Si—SiO$_2$ interface is alleviated. Thus, a field plate structure is formed also in the present embodiment.

With the above-mentioned arrangement, the oxygen doped semi-insulating polycrystalline silicon film 106 is directly formed in the channel isolation region 102 on the surface of the N-type silicon substrate 101. By adopting the above-mentioned structure, the silicon interface state Qss is increased more remarkably in the present channel isolation region 102 than in the channel isolation region 92 of the third embodiment. Therefore, the reduction in the lifetime of holes 110 of minority carriers in the N-type silicon substrate 101 can be highly promoted similarly to the case of the third embodiment.

Although the distance L2 between the channels is set to 350 µm, it is advantageous for the distance to be 300 µm or longer in terms of the separation of carriers. It is to be noted that the rightsizing of the distance is required because the chip size is increased. Moreover, although the width of the channel isolation region 102, or the interval between the SiO$_2$ film 105a of the left-hand portion 103a and the SiO$_2$ film 105b of the right-hand portion 103b is set to 100 µm, the interval is required to be not smaller than 50 µm.

Moreover, the Al electrode 109 formed in the position of the channel isolation region 102 can function also as a light shading film.

(Fifth Embodiment)

Figure 12:
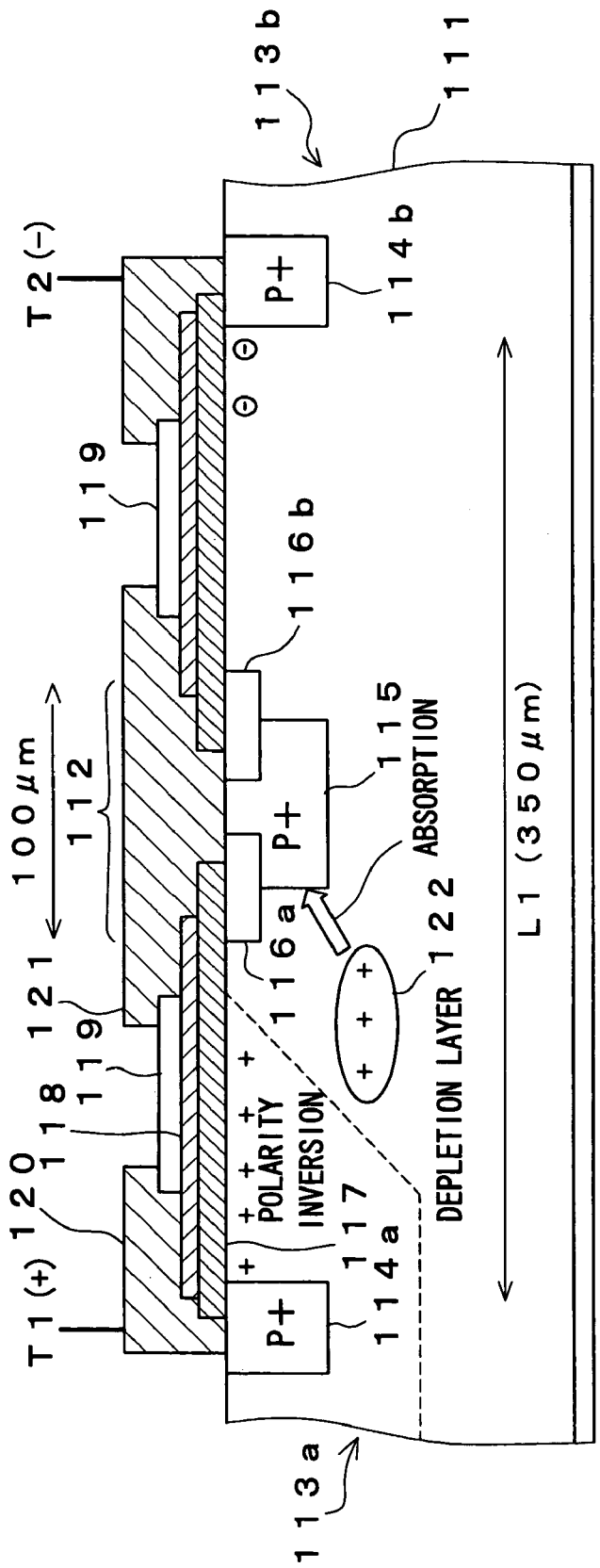
FIG. 12 is a sectional view showing the construction of a channel isolation region different from those in FIG. 9 through FIG. 11.

FIG. 12 is a sectional view of an N-type silicon substrate 111 in the neighborhood of the channel isolation region 112 showing the passivation structure of the present embodiment. A channel isolation region 112 in the present embodiment is constructed of a short-circuit diode formed short-circuited on the surface of the N-type silicon substrate 111.

A P-type diffusion region 115 is formed in the region of the channel isolation region 112 on the surface of the N-type silicon substrate 111, and an N-type diffusion region 116a as a channel stopper is formed extended from the N-type silicon substrate 111 to the P-type diffusion region 115 in the position of the left-hand side surface of the P-type diffusion region 115, and an N-type diffusion region 116b is similarly formed in the position of the right-hand side surface of portion 113b in the P-type diffusion region 115.

An SiO$_2$ film 117 is formed over an anode diffusion region 114 to the N-type diffusion region 116 in each of the left-hand portion 113a and the right-hand portion 113b. Then, an oxygen doped semi-insulating polycrystalline silicon film 118 is formed extended from the neighborhood of the anode diffusion region 114 on the SiO$_2$ film 117 to the neighborhood of the N-type diffusion region 116. Further, an SiO$_2$ film 119 is formed on the oxygen doped semi-insulating polycrystalline silicon film 118 by the chemical vapor deposition method. Then, an Al electrode 120 is formed extended from the surface of the anode diffusion region 114 to the surface of the SiO$_2$ film 119 and connected to a lead frame T1 or a lead frame T2. On the other hand, an Al electrode 121 is formed extended from the surface of the SiO$_2$ film 119 of the left-hand portion 113a to the surface of the SiO$_2$ film 119 of the right-hand portion 113b and connected to the N-type silicon substrate 111. By thus bringing both ends of the oxygen doped semi-insulating polycrystalline silicon film 118 in contact with the Al electrodes 120 and 121 for the formation of a potential gradient between both the Al electrodes 120 and 121, the concentration of electric fields on the Si—SiO$_2$ interface is alleviated. Thus, a field plate structure is formed also in the present embodiment.

With the above-mentioned construction, the short-circuit diode short-circuited by the P-type diffusion region 115 and the N-type diffusion region 116 is constructed in the channel isolation region 112 on the surface of the N-type silicon substrate 111. Therefore, holes 122 of minority carriers in the N-type silicon substrate 111 are absorbed into the P-type diffusion region 115 of the short-circuit diode, and the lifetime of the holes 122 is reduced.

Although the distance L2 between the channels is set at 350 µm, it is advantageous for the distance to be 300 µm or longer in terms of the separation of carriers. It is to be noted that the rightsizing of the distance is required because the chip size is increased. Moreover, although the width of the channel isolation region 112, or the distance between the outer edge of the N-type diffusion region 116a of the left-hand portion 113a and the outer edge of the N-type diffusion region 116b of the right-hand portion 113b is set to 100 µm, the width is required to be not smaller than 50 µm.

Moreover, the Al electrode 121 formed in the position of the channel isolation region 112 can also function as a light shading film, which can restrict the occurrence of carriers as a consequence of the intrusion of light from the region of the short-circuit diode during light reception.

(Sixth Embodiment)

Figure 13:
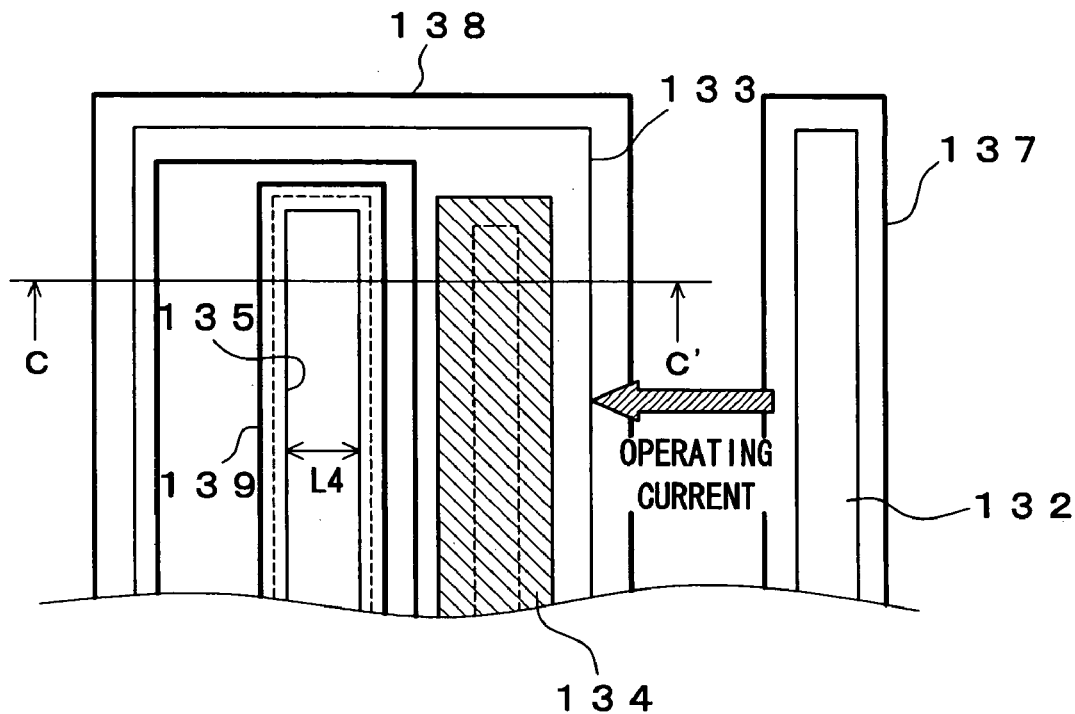
FIG. 13 is a fragmentary view showing the pattern layout of a bidirectional photothyristor chip different from those in FIG. 1 and FIG. 8.
Figure 14:
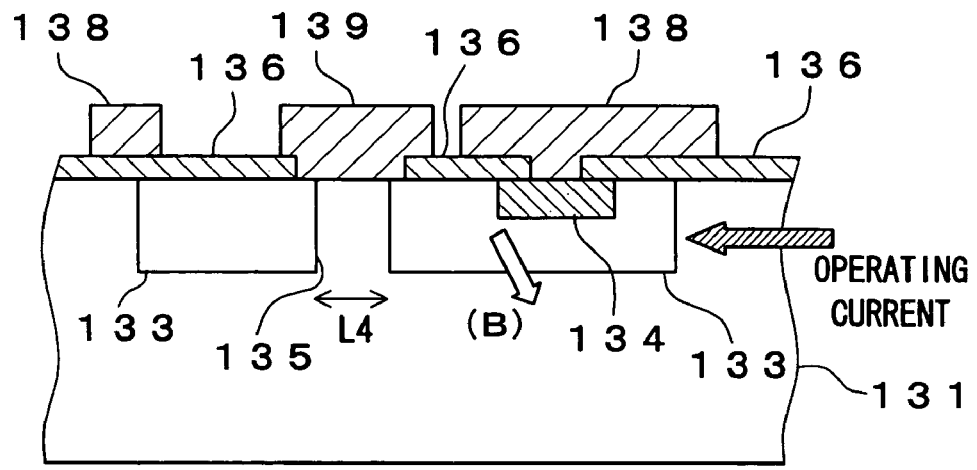
FIG. 14 is a schematic sectional view taken along the arrow line C–C' in FIG. 13.
Figure 15:
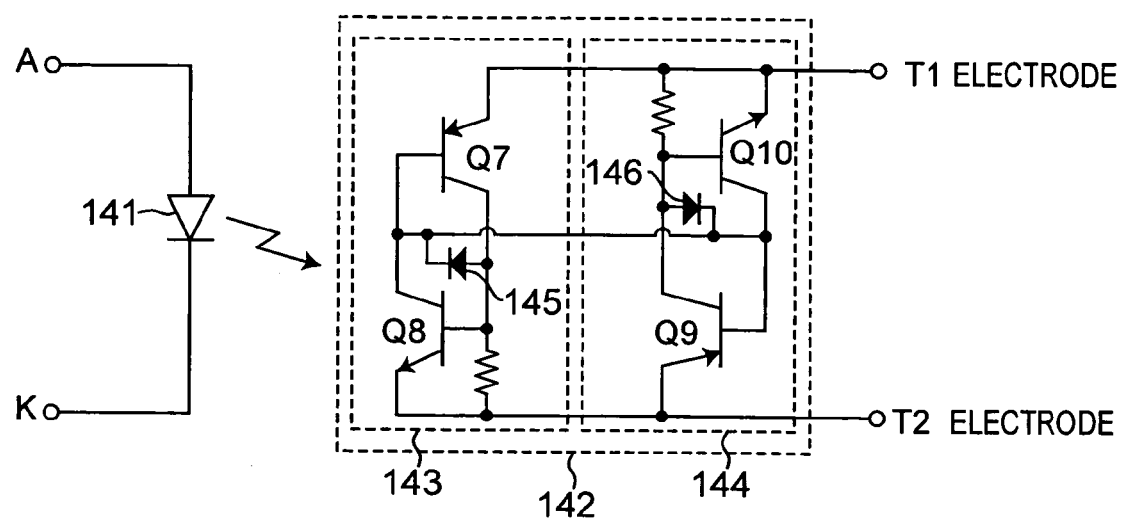
FIG. 15 is an equivalent circuit diagram of a light-fired coupler with use of the bidirectional photothyristor chip shown in FIG. 13.

This embodiment relates to a bidirectional photothyristor chip with a Schottky barrier diode formed in between the gate diffusion region and the N-type silicon substrate constituting the PNPN portion. FIG. 13 is a pattern layout showing a section of a Schottky barrier diode formed on one CH side of a bidirectional photothyristor chip in this embodiment. FIG. 14 is a sectional view taken along the arrow line C–C' in FIG. 13. FIG. 15 is an equivalent circuit diagram of a light-fired coupler with use of the bidirectional photothyristor chip of the embodiment.

In the bidirectional photothyristor chip in the present embodiment, a P-gate diffusion region that is equivalent to the base region of the NPN transistor is in a saturated state during commutation. However, with the presence of the Schottky barrier diode, the amount of minority carriers of the P-gate diffusion region being injected into the N-type silicon substrate is reduced to improve the commutation characteristic.

As shown in FIG. 13 and FIG. 14, on the front surface side of an N-type silicon substrate 131 that is, for example, in the left-hand portion, an anode diffusion region (P-type) 132, a P-gate diffusion region (P-type) 133 and a cathode diffusion region (N-type) 134 are formed over almost the entire width of the N-type silicon substrate 131 except a portion of the field distance $L_2$ along the channel isolation region (unshown) in the similar manner as the above-described first embodiment so as to form the PNPN portion from the anode diffusion region 132 toward the cathode diffusion region 134. It is to be noted that the concrete construction of the channel isolation region is any one of the constructions in the aforementioned second embodiments to the fifth embodiments.

Further, a rectangular aperture 135, in which no P-type impurity is diffused, is provided parallel to the cathode diffusion region 134 within a region of the P-gate diffusion regions 133 in which the cathode diffusion region 134 is not provided.

Moreover, an $SiO_2$ film 136 is formed on the front surface of the N-type silicon substrate 131, and openings are formed above part of the anode diffusion region 132, the cathode diffusion region 134, and the aperture 135 at the $SiO_2$ film 136. Further, an Al electrode 137 is formed in the opening above the anode diffusion region 132 at the $SiO_2$ film 136, one side of a rectangle ring-shaped Al electrode 138 is formed in the opening above the cathode diffusion region 134, and an Al electrode 139 is formed in the opening above the aperture 135. It is to be noted that the Al electrode 137 that is in contact with the anode diffusion region 132 is connected to the lead frame T1 (or T2) (see FIG. 1), while the Al electrode 138 that is in contact with the cathode diffusion region 134 is connected to the lead frame T2 (or T1) (see FIG. 1).

The Al electrode 139 is in direct contact with the N-type silicon substrate 131 in the aperture 135 via the opening of the $SiO_2$ film 136. Thus, a Schottky barrier diode is formed between the P-gate diffusion region 133 and the N-type silicon substrate 131. Therefore, the injection of minority carriers (holes) from the P-gate diffusion region 133 to the N-type silicon substrate 131 as indicated by the arrow (B) is restrained. As a result, the amount of carriers remaining in the N-type silicon substrate 131 is reduced, which further improves the commutation characteristic in combination with the effects of restraining inter-channel movement of the minority carriers (holes) provided by the channel isolation region. In the aforementioned description, Al is employed as the metallic material that constitutes the Schottky barrier diode. However, it is acceptable to employ a metallic material of Cr, Mo, Ti, Pt or the like in place of Al.

In the equivalent circuit of a light-fired coupler shown in FIG. 15, there are shown an LED 141, a bidirectional photothyristor chip 142 of this embodiment, a photothyristor 143 on the CH1 side, a photothyristor 144 on the CH2 side, PNP transistors Q7, Q9 composed of the anode diffusion region 132, the N-type silicon substrate 131 and the P-gate diffusion region 133, NPN transistors Q8, Q10 composed of the cathode diffusion region 134, the P-gate diffusion region 133 and the N-type silicon substrate 131, and Schottky barrier diodes 145, 146 described above.

Figure 16:
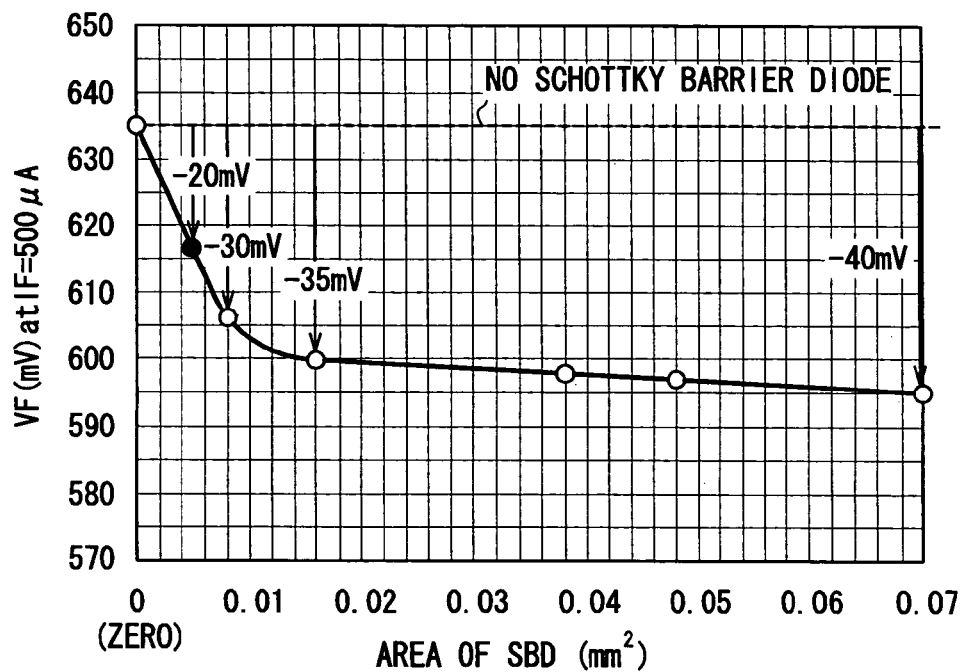
FIG. 16 is a view showing relation between the area of a Schottky barrier diode and a forward voltage VF.
Figure 17:
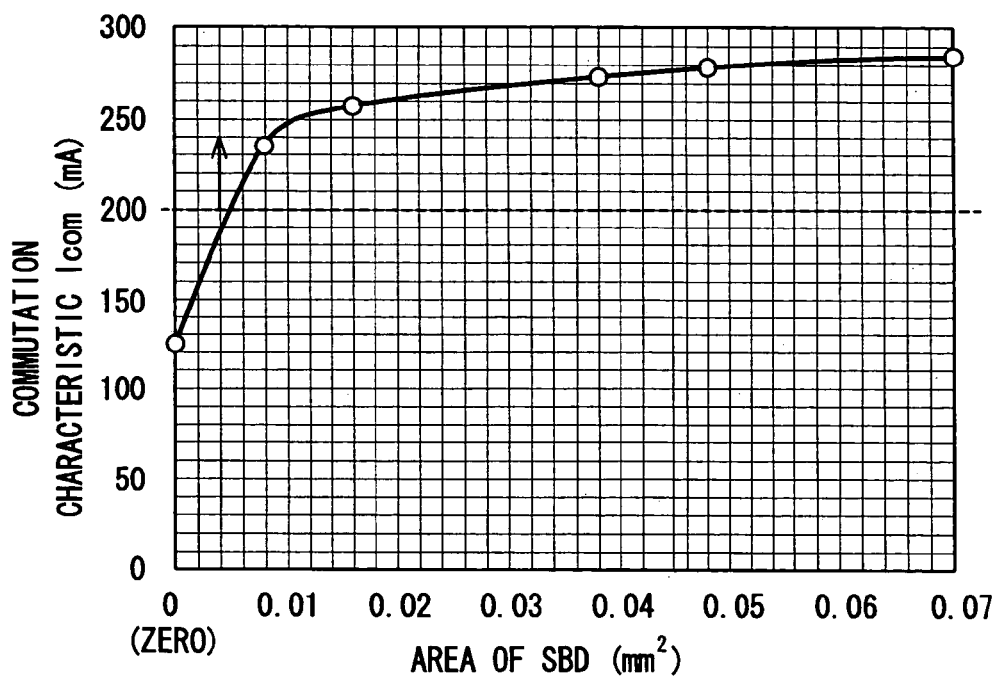
FIG. 17 is a view showing relation between the area of the Schottky barrier diode and the commutation characteristic.

FIG. 16 shows relation between the area of a Schottky barrier diode (SBD) and a forward voltage VF. FIG. 17 shows relation between the area of the Schottky barrier diode (SBD) and the commutation characteristic Icom. FIG. 16 indicates that the area and the forward voltage VF have an approximately inversely proportional relation. FIG. 17 indicates that the area and the commutation characteristic Icom have an approximately proportional relation. Therefore, a proper lower limit value of the area of the Schottky barrier diodes 145, 146 is determined depending on the desired commutation characteristic Icom of the thyristor to be adopted. In concrete, the proper lower limit value is determined depending on the parameters of the amount of the remaining carriers, the lifetime of the remaining carriers, a grace period to the occurrence of the malfunction and so on. Since an increase in the area leads to the expansion of the chip size, a proper upper limit value of the area is determined by a maximum value capable of tolerating the evil influence.

As one concrete example, the area of the Schottky barrier diodes 145, 146 is set so that the forward voltage VF of the Schottky barrier diodes 145, 146 becomes equal to or lower than 0.615 V (shown by a filled circle in FIG. 16), which is 20 mV lower than the forward voltage VF (about 0.635 V) across the P-gate diffusion region 133 and the N-type silicon substrate 131 of the thyristor to be adopted. The reason why the forward voltage VF of the Schottky barrier diodes 145, 146 is set as described above is to obtain the effect of reducing the current as a consequence of clamping the current (corresponding to the carrier injection that causes the malfunction) flowing from the base to the collector of the NPN transistors Q8, Q10 by the Schottky barrier diodes 145, 146. It is to be noted that the forward voltage VF of the Schottky barrier diodes 145, 146 should preferably be 30 mV to 35 mV lower than the forward voltage VF across the P-gate diffusion region 133 and the N-type silicon substrate 131.

That is, the area of the Schottky barrier diodes 145, 146 can easily be set as follows. First of all, the length of the Schottky barrier diodes 145, 146 is set to a length equal to that of the adjacent cathode diffusion region 134. Then, the width of the Schottky barrier diodes 145, 146 is rightsized so as to provide the forward voltage VF set as described above.

With regard to the structure of the Schottky barrier diodes 145, 146, which is used in an environment in which a maximum voltage close to 800 V is applied due to the device characteristics, a width L4 of the aperture 135 of the P-gate diffusion region 133 is therefore required to be set to a distance such that the Schottky barrier diodes 145, 146 can effect pinch-off within its withstand voltage. In the present embodiment, the width is set to 50 μm.

As described above, in the bidirectional photothyristor chip of the present embodiment, the Schottky barrier diodes are formed between the P-gate diffusion region 133 and the N-type silicon substrate 131. Therefore, the injection of minority carriers (holes) from the P-gate diffusion region 133 into the N-type silicon substrate 131 is restrained to reduce the amount of remaining carriers, which further improves the commutation characteristic in combination with the effects of the channel isolation region. Therefore, using the bidirectional photothyristor chip of the embodiment allows omission of the main thyristor to implement an SSR with reduced parts count more easily.

(Seventh Embodiment)

Figure 18:
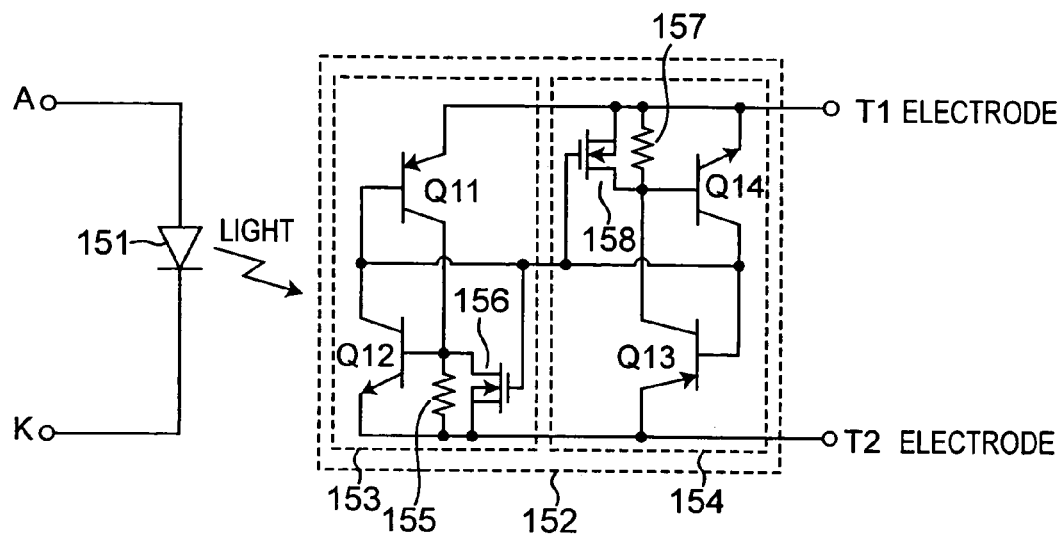
FIG. 18 is an equivalent circuit diagram of a light-fired coupler with use of a bidirectional photothyristor chip different from those in FIG. 1, FIG. 8 and FIG. 13.

This embodiment relates to a bidirectional photothyristor chip that has a zero cross function. FIG. 18 is an equivalent circuit diagram of a light-fired coupler with use of a bidirectional photothyristor chip in the present embodiment. Similarly to the bidirectional photothyristor chip in the first embodiment, the bidirectional photothyristor chip 152 of this embodiment is composed of a photothyristor 153 on the CH1 side having a PNP transistor Q11 and an NPN transistor Q12, and a photothyristor 154 on the CH2 side having a PNP transistor Q13 and an NPN transistor Q14, and the channel isolation region in any one of the second embodiment to the fifth embodiment is formed between both the photothyristors 153 and 154. Reference numeral 151 denotes an LED.

Further, between the base of the NPN transistor Q12 on the CH1 side and an electrode T2, an N-type FET (Field Effect Transistor) 156 is connected in parallel with a gate resistance 155. Likewise, between the NPN transistor Q14 on the CH2 side and an electrode T1, an N-type FET (Field Effect Transistor) 158 is connected in parallel with a gate resistance 157. While the gate of the N-type FET 156 is connected to the base of the PNP transistor Q11, the gate of the N-type FET 157 is connected to the base of the PNP transistor Q13.

Consequently, in the vicinity of a zero cross point of the power voltage applied as a bias between the electrode T1 and the electrode T2, the N-type FETs 156, 158 are off, and a base-emitter voltage corresponding to a resistance value of the gate resistances 155, 157 is applied to the NPN transistors Q12, Q14, so that upon reception of a light signal, the NPN transistors Q12, Q14 are turned on by the contribution of a photoelectric current generated in the P-gate diffusion region. Contrary to this, at a point of time away from the zero cross point of the power voltage, the N-type FETs 156, 158 are turned on, so that the connection from the base to the emitter of the NPN transistors Q12, Q14 is short-circuited, which prevents the NPN transistor from being turned on even if a light signal is received.

Thus, the zero cross function for turning the photothyristors on only in the vicinity of the zero cross point of the power voltage applied as a bias between the electrode T1 and the electrode T2 is obtained.

Figure 19:
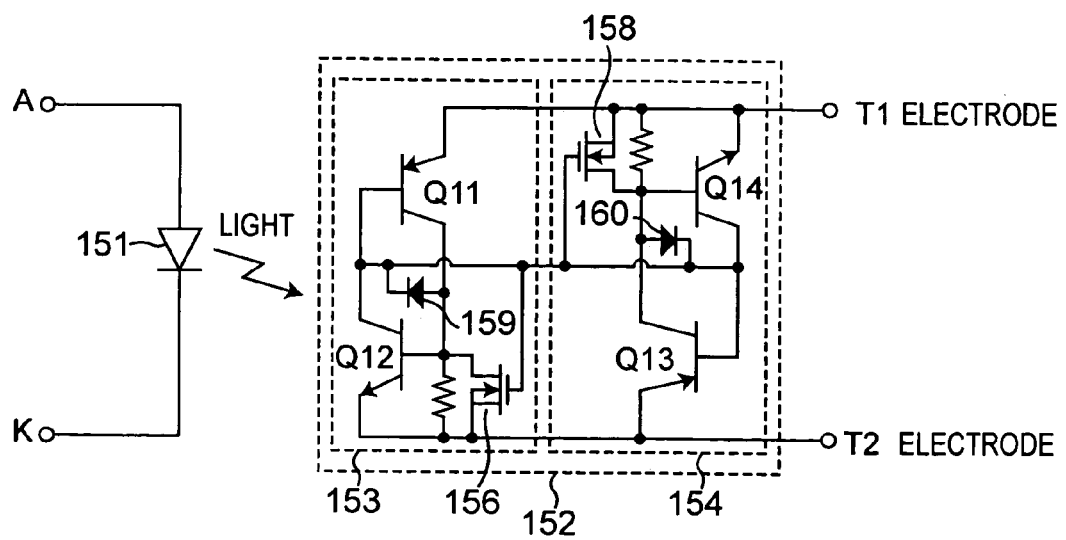
FIG. 19 is an equivalent circuit diagram of a light-fired coupler with use of a bidirectional photothyristor chip different from those in FIG. 1, FIG. 8, FIG. 13 and FIG. 18.

As shown in FIG. 19, a bidirectional photothyristor chip with a Schottky barrier diode formed to have the zero cross function can be constituted by forming Schottky barrier diodes 159, 160 between the base and the collector of the NPN transistors Q12, Q14 in the structure of the bidirectional photothyristor chip having the zero cross function shown in FIG. 18.

It is to be noted that the N-type FETs 156, 158 can be made up of other switching devices that have control terminals.

In the description stated above, each of the constructions of the channel isolation regions, the formation of the Schottky barrier diodes, and the zero cross function is separately described in the respective embodiments. However, it is not necessarily necessary to provide these constructions and functions in a separate manner, and it is totally acceptable to provide them in selective combination. For example, the construction of the channel isolation region in any one of the second embodiment to the fifth embodiment can be combined with the Schottky barrier diode in the sixth embodiment and the zero cross function in the seventh embodiment, or either one of them.

Figure 20:
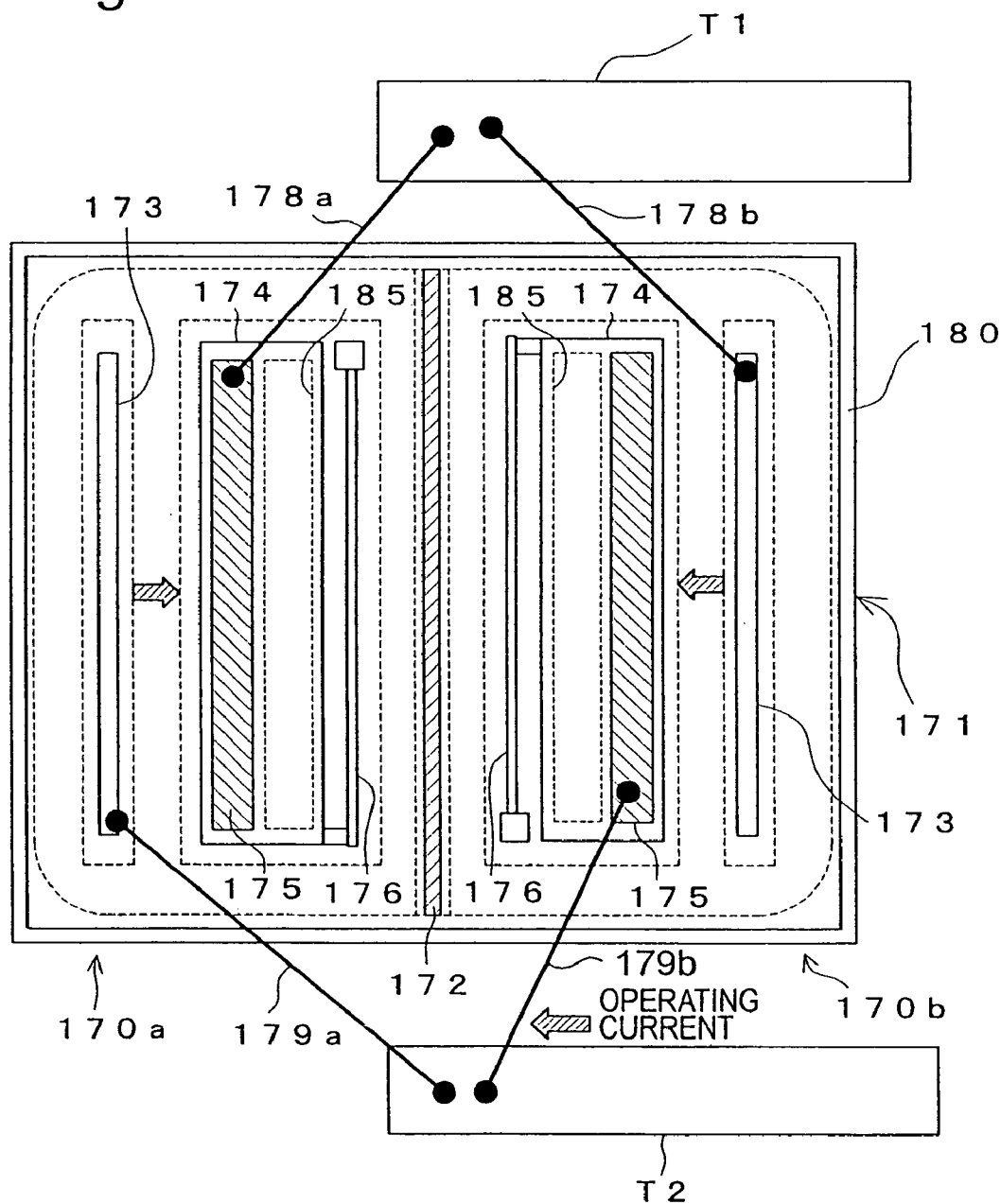
FIG. 20 is a view showing the concrete pattern layout of the bidirectional photothyristor chip shown in FIG. 8.
Figure 21:
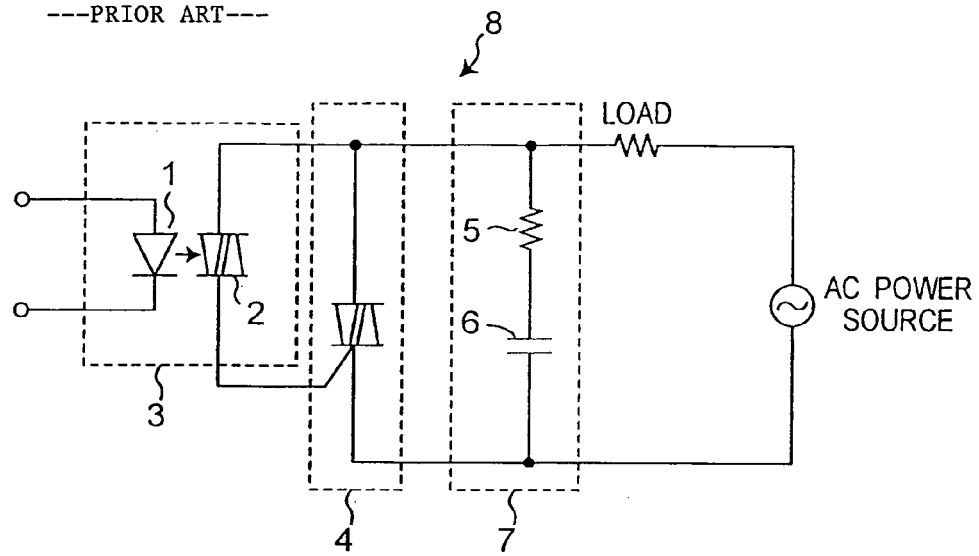
FIG. 21 is a view showing the circuitry of a conventional SSR.

Further, FIG. 20 shows the concrete pattern layout of the bidirectional photothyristor chip in which the cathode diffusion region of the first embodiment shown in FIG. 8 is positioned on the side of the channel isolation region. In FIG. 20, there are shown a left-hand portion 170a, a right-hand portion 170b, an N-type silicon substrate 171, a channel isolation region 172, an anode diffusion region (P-type) 173, a P-gate diffusion region (P-type) 174, a cathode diffusion region (N-type) 175, a gate resistance 176, Au wires 178a, 178b, 179a, 179b, an N-type diffusion region 180, an aperture 185, and lead frames T1, T2. Moreover, FIG. 20 shows a pattern layout in which the left-hand portion 40a and the right-hand portion 40b in FIG. 1 are reversed with the layout of each section disposed inside each of the portions unchanged. Therefore, the anode diffusion region 173 is positioned on the opposite side of the channel isolation region, and the p-gate diffusion region 174 is positioned on the side of the channel isolation region. Further, in the p-gate diffusion region 174, the cathode diffusion region 175 is positioned on the side of the anode diffusion region 173, and the aperture 185 is positioned on the side of the channel isolation region.

When a light-fired coupler is formed from the bidirectional photothyristor chip, an LED is disposed above the central portion (that is, the vicinity of the channel isolation region 172) of the bidirectional photothyristor chip. Consequently, the aperture 185 of the p-gate diffusion region 174 disposed on the side of the channel isolation region is disposed in the position close to the LED, so that a light receiving characteristic higher than that in the case of the bidirectional photothyristor chip shown in FIG. 1 is obtained. In other words, the luminous sensitivity characteristic is increased. It is to be noted that in the case where the anode diffusion region 43 is disposed on the side of the channel isolation region as shown in FIG. 1, and the minority carriers in the N-type silicon substrate 41 goes over the channel isolation region 42 into the reverse channel side during commutation (during AC voltage inversion), the minority carriers gone therein are absorbed in the anode diffusion region 43 in the reverse channel. Therefore, it can be said that the case of the bidirectional photothyristor chip shown in FIG. 1 is advantageous in terms of the improvement of the commutation characteristic.

More specifically, if a bidirectional photothyristor chip which places importance on the commutation characteristic is required, then the bidirectional photothyristor chip shown in FIG. 1 may be used, whereas if a bidirectional photothyristor chip which places importance on the luminous sensitivity characteristic is required, then the bidirectional photothyristor chip shown in FIG. 20 may be used. It will be appreciated that in the case of applying the bidirectional photothyristor chip in FIG. 20, the above-described constructions of the channel isolation regions, the formation of the Schottky barrier diodes and the zero cross function are selectively combined.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bidirectional photothyristor chip, comprising:
a first photothyristor portion and a second photothyristor portion each including an anode diffusion region of a first conductive type and a cathode diffusion region of a second conductive type and formed away from each other on a surface of one semiconductor chip; and
a channel isolation region formed on the surface of the semiconductor chip for separating a channel of the first photothyristor portion and a channel of the second photothyristor portion, wherein
the anode diffusion region of the first photothyristor portion and the cathode diffusion region of the second photothyristor portion are electrically connected to each other, while the cathode diffusion region of the first photothyristor portion and the anode diffusion region of the second photothyristor portion are electrically connected to each other; and
the anode diffusion region is disposed closer to a side of the channel isolation region than the cathode diffusion region in the first and second photothyristor portions.

2. The bidirectional photothyristor chip as claimed in claim 1, wherein
the respective diffusion regions are disposed in parallel with the channel isolation region with the channel isolation region interposed therebetween.

3. The bidirectional photothyristor chip as claimed in claim 1, wherein
the channel isolation region is constituted of a dicing groove formed on the surface of the semiconductor chip.

4. The bidirectional photothyristor chip as claimed in claim 1, wherein
the semiconductor chip is constituted of an N-type silicon substrate, and
the channel isolation region is constituted by including an oxygen doped semi-insulating polycrystalline silicon film doped with phosphorus formed on a surface of the N-type silicon substrate.

5. The bidirectional photothyristor chip as claimed in claim 1, wherein
the semiconductor chip is constituted of an N-type silicon substrate, and
the channel isolation region is constituted by including an oxygen-doped semi-insulating polycrystalline silicon film formed in contact with the surface of the N-type silicon substrate.

6. The bidirectional photothyristor chip as claimed in claim 1, wherein
the channel isolation region is constituted by including a short-circuit diode formed on the surface of the semiconductor chip.

7. The bidirectional photothyristor chip as claimed in claim 1, wherein
the respective photothyristor portions further have a gate photoreceptor diffusion region, and
the gate photoreceptor diffusion region is disposed closer to a side of the channel isolation region than the anode diffusion region.

8. The bidirectional photothyristor chip as claimed in claim 1, wherein
the respective photothyristor portions include a PNPN section constituted of an anode diffusion region that has one conductive type out of N type and P type, a substrate that has the other conductive type out of N type and P type, a gate diffusion region that is opposed to the anode diffusion region and has the one conductive type, and a cathode diffusion region that is formed oppositely to the anode diffusion region inside the gate diffusion region and has the other conductive type, and
a Schottky barrier diode is formed in between the gate diffusion region and the substrate, that constitute the PNPN section.

9. The bidirectional photothyristor chip as claimed in claim 8, wherein
the Schottky barrier diode is opposed to the cathode diffusion region and is also formed with a length equal to that of the cathode diffusion region and with a prescribed width.

10. The bidirectional photothyristor chip as claimed in claim 9, wherein
an area of the Schottky barrier diode is changed by changing the width of the Schottky barrier diode, and
a forward voltage of the Schottky barrier diode is controllable by changing the area of the Schottky barrier diode.

11. The bidirectional photothyristor chip as claimed in claim 10, wherein
the width of the Schottky barrier diode is so set that a forward voltage of the Schottky barrier diode is lower by not smaller than 20 mV than the forward voltage between the gate diffusion region and the substrate.

12. The bidirectional photothyristor chip as claimed in claim 10, wherein
a distance between the two diffusion regions located with interposition of the Schottky barrier diode is set to a distance at which the Schottky barrier diode can effect pinch-off within its withstand voltage.

13. The bidirectional photothyristor chip as claimed in claim 1, wherein
the respective photothyristor portions include a PNPN section constituted of an anode diffusion region that has one conductive type out of N type and P type, a substrate that has the other conductive type out of N type and P type, a gate diffusion region that is opposed to the anode diffusion region and has the one conductive type, and a cathode diffusion region that is formed oppositely to the anode diffusion region inside the gate diffusion region and has the other conductive type,
a gate resistance and a switching device are connected in parallel in between a base and an emitter electrode of an NPN transistor which is constituted of the cathode diffusion region, the gate diffusion region and the substrate and also constitutes the PNPN section, and,
a control terminal of the switching device is connected to a base of a PNP transistor which is constituted of the anode diffusion region, the substrate and the gate diffusion region and also constitutes the PNPN section.

14. The bidirectional photothyristor chip as claimed in claim 1, wherein
the semiconductor chip is constituted of an N-type silicon substrate, and
on a back surface of the N-type silicon substrate, an N$^+$ layer doped with phosphorus at a concentration of not smaller than $10^{15}$ cm$^{-3}$ and not larger than $10^{18}$ cm$^{-3}$ is formed.

15. The bidirectional photothyristor chip as claimed in claim 1, further comprising at least any two of:
a construction of the channel isolation region in the bidirectional photothyristor chip as claimed in any one of claims 3 to 6;
a construction of the PNPN section in the bidirectional photothyristor chip as claimed in claim 7 and a Schottky barrier diode; and
a construction of the N$^+$ layer on the back surface of the N-type silicon substrate in the bidirectional photothyristor chip as claimed in claim 14.

16. The bidirectional photothyristor chip as claimed in claim 1, wherein
the semiconductor chip is constituted of an N-type silicon substrate, and
on a back surface of the N-type silicon substrate, an N$^+$ layer doped with phosphorus at a concentration of not smaller than $10^{15}$ cm$^{-3}$ and not larger than $10^{18}$ cm$^3$ is formed.

17. A light-fired coupler comprising the bidirectional photothyristor chip as claimed in claim 16 and a light emitting diode.

18. A solid state relay comprising the light-fired coupler as claimed in claim 17 and a snubber circuit.

19. A light-fired coupler comprising the bidirectional photothyristor chip as claimed in claim 1 and a light emitting diode.

20. A solid state relay comprising the light-fired coupler as claimed in claim 19 and a snubber circuit.

* * * * *